(12) United States Patent
Xu et al.

(10) Patent No.: US 10,571,973 B2
(45) Date of Patent: Feb. 25, 2020

(54) MAGNETIC SENSORS FOR ELECTRONIC DEVICES

(71) Applicant: Apple Inc., Cupertino, CA (US)

(72) Inventors: Chi Xu, Santa Clara, CA (US); Houtan R. Farahani, San Ramon, CA (US); Richard D. Kosoglow, San Jose, CA (US); John C. DiFonzo, Emerald Hills, CA (US)

(73) Assignee: APPLE INC., Cupertino, CA (US)

( * ) Notice: Subject to any disclaimer, the term of this patent is extended or adjusted under 35 U.S.C. 154(b) by 139 days.

(21) Appl. No.: 15/582,107

(22) Filed: Apr. 28, 2017

(65) Prior Publication Data

US 2018/0314316 A1    Nov. 1, 2018

(51) Int. Cl.
*G06F 1/16* (2006.01)
*G01R 33/06* (2006.01)

(52) U.S. Cl.
CPC ........... *G06F 1/1677* (2013.01); *G01R 33/06* (2013.01)

(58) Field of Classification Search
None
See application file for complete search history.

(56) References Cited

U.S. PATENT DOCUMENTS

| | | | |
|---|---|---|---|
| 8,289,115 B2 | 10/2012 | Cretella, Jr. et al. | |
| 9,007,306 B2 | 4/2015 | Liu | |
| 2003/0112004 A1* | 6/2003 | Luetzow | G01D 5/145 324/207.13 |
| 2006/0105757 A1* | 5/2006 | Kang | G06F 1/1624 455/418 |
| 2012/0278638 A1 | 11/2012 | Wang et al. | |
| 2013/0033259 A1* | 2/2013 | Hara | G01R 33/072 324/207.24 |
| 2014/0071608 A1* | 3/2014 | Masaoka | G06F 1/1656 361/679.26 |
| 2014/0191999 A1 | 7/2014 | Kim | |
| 2015/0097788 A1 | 4/2015 | Sip | |
| 2016/0137194 A1* | 5/2016 | Kajiwara | B60W 20/50 701/22 |
| 2017/0010657 A1* | 1/2017 | Schneider | G01B 5/24 |

FOREIGN PATENT DOCUMENTS

WO    2016/081072 A2    5/2016

* cited by examiner

*Primary Examiner* — Paul Yen
(74) *Attorney, Agent, or Firm* — Dorsey & Whitney LLP

(57) ABSTRACT

An electronic device can include a first and second portions that are pivotally coupled to each other so that the electronic device can have at least a closed configuration and an open configuration. A magnetic sensor system can be carried by the electronic device to detect the closed configuration so that the electronic device can automatically turn to a mode, such as a sleep mode, when the electronic device is bought to the closed configuration. A magnetic sensor can have a detection axis that targets a horizontal component of a magnetic field. A triggering magnetic element can be laterally offset relative to the magnetic sensor. The magnetic sensor can also be a magneto-resistive sensor. The electronic device can also include a second set of magnetic sensor system to confirm when the electronic device is brought to the closed configuration.

7 Claims, 14 Drawing Sheets

| FIRST SENSOR | SECOND SENSOR | MODE |
|---|---|---|
| YES | YES | SLEEP MODE |
| YES | NO | NO CHANGE |
| NO | YES | NO CHANGE |
| NO | NO | ACTIVE MODE |

*FIG. 9*

MAGNETIC SENSORS FOR ELECTRONIC DEVICES

FIELD

The described embodiments relate generally to magnetic sensor systems for electronic devices. More particularly, the described embodiments relate to magnetic sensor systems that are used in association with a detection of a particular configuration of the electronic devices. Even more particularly, the described embodiments relate to magnetic sensor systems that may include features that reduce the effect of magnetic interference.

BACKGROUND

Recent advances in technologies allow electronic devices to become increasingly automatic in performing many different tasks. Electronic devices may rely on different kinds of sensors to detect the ambient environment to provide automatic responses to changes. Some of those sensors may utilize magnets. Also, other electronic components, such as loudspeakers, may also utilize magnets to perform different functions. The prevalence of magnets can sometimes cause magnetic interference to other electronic devices and can unintentionally trigger magnetic sensors in other electronic devices.

SUMMARY

This paper describes various embodiments related to magnetic sensor systems for electronic devices that contain different features to reduce magnetic interference.

According to one embodiment, a laptop computer is described. The laptop computer can include a first housing that can be used to carry a display at a first surface. The laptop computer can also include a second housing that is pivotally coupled to the first housing. The second housing can be used to carry a keyboard at a second surface that at least partially faces the first surface. The first housing can move towards the second housing such that in a closed configuration, the first and second surfaces are at least in close proximity and are generally parallel to each other. The laptop computer can further include at least two magnetic sensor systems. In each of the magnetic sensor systems, the system can include a triggering magnetic element carried by the first housing and a magnetic sensor carried by the second housing. Moreover, in the closed configuration, the triggering magnetic element and the magnetic sensor can be laterally offset from each other.

According to another embodiment, a laptop computer is described. The laptop computer can include a first and second portions that are coupled to each other and pivotally movable relative to each other such that in a closed configuration, edges of the first and second portions can in contact and can be generally parallel to each other. The laptop computer can also include a triggering magnetic element carried by the first portion. The triggering magnetic element can be located a first distance from a first portion edge. The laptop computer can further include a magnetic sensor carried by the second portion and located a second distance from a second portion edge. The second portion edge can be in contact with and parallel to the first portion edge in the closed configuration, and the first distance can be different than the second distance.

According to yet another embodiment, a method can be operated by a processor to alter an operational state of a laptop computer using two magnetic sensor systems in communication with the processor is described. The magnetic sensor systems can each include a triggering magnetic element carried by a first portion of the laptop computer, and a corresponding magnetic sensor carried by the second portion. The magnetic sensor can be selectively sensitive to a triggering magnetic field provided by the associated triggering magnetic element. In one case, the magnetic sensor can be carried by a second portion of the laptop computer. The second portion can be pivotally coupled to the first portion. When the processor determines that a first and a second magnetic sensor each have a same detection status of the triggering magnetic field, then the processor can alter an operational state of the laptop in accordance with the detection status. Otherwise, the processor can maintain a current operational state of the laptop computer.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which:

FIG. 9 illustrates a table relating to how a pair of magnetic sensor systems cooperates to confirm a particular configuration of an electronic device.

Figure 1:
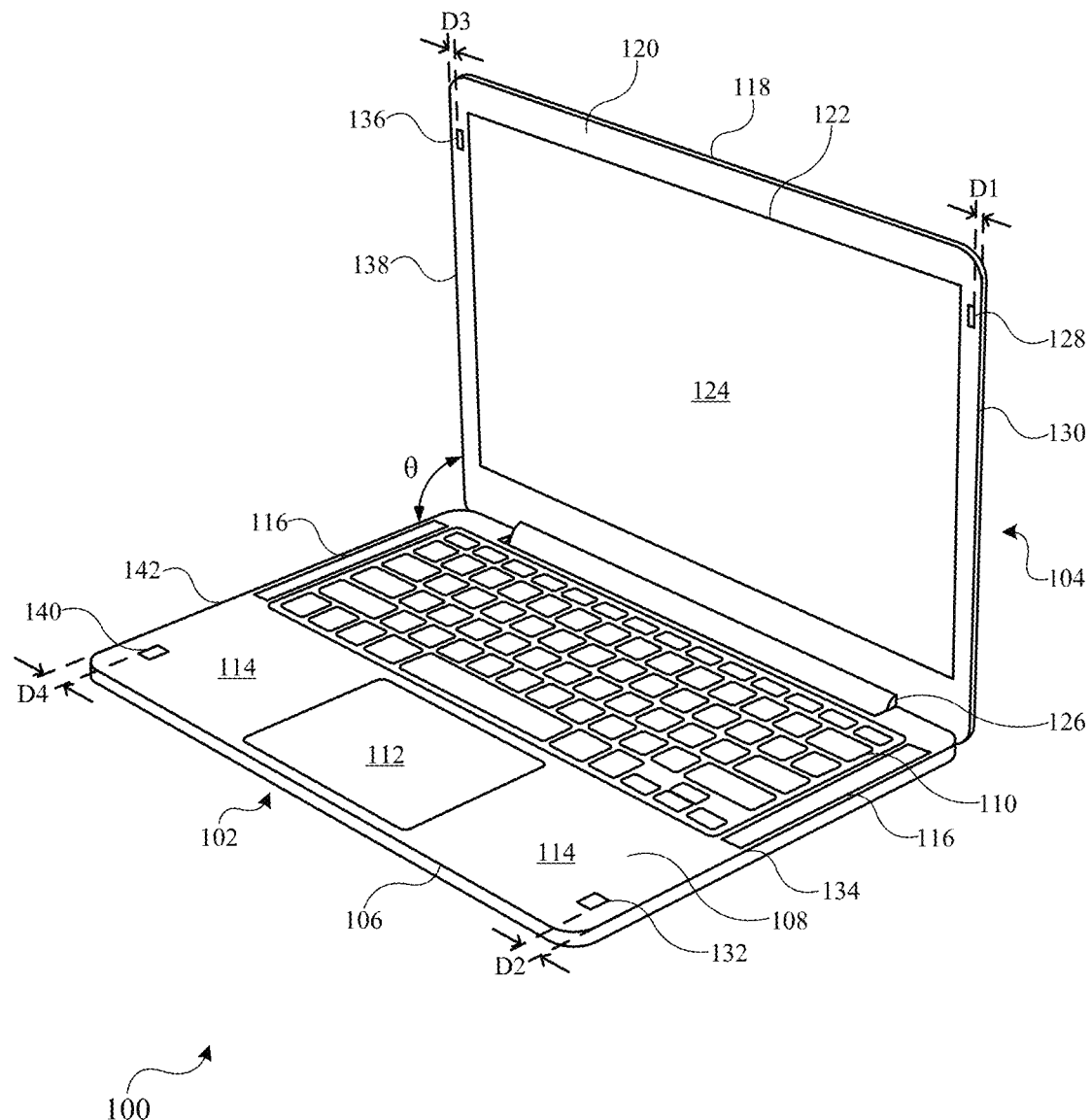
FIG. 1 illustrates a perspective view of an electronic device having a pair of magnetic sensors in accordance with an embodiment.

Those skilled in the art will appreciate and understand that, according to common practice, various features of the drawings discussed below are not necessarily drawn to scale, and that dimensions of various features and elements of the drawings can be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Embodiments described herein relate to electronic devices (e.g., a laptop, a tablet, a smartphone, etc.) that can have different portions that are movable relative to each other. For example, a display portion of a laptop can be pivoted relative to a base portion of the laptop. Hence, the laptop can have at least a closed configuration and an open configuration. Likewise, a tablet device with a front portion having a display can have a cover that can be turned behind the tablet so as to contact a back portion of the tablet device or be turned to cover the front portion of the tablet device. It should be noted that the above are non-exclusive examples of different electronic devices having different configurations. Moreover, once a particular configuration of the electronic device has been detected, the electronic device may alter an operation accordingly.

Specifically, according to some embodiments, an electronic device can include one or more magnetic sensor systems that can be used to deduce a current configuration or a change in the configuration of the electronic device. In this way, the magnetic sensor systems can be used in a manner that causes the electronic device to operate in a current operating mode in accordance with the current configuration and switch from the current operating mode to another operating mode in accordance with a changed configuration. In one embodiment, an electronic device can take the form of a laptop that has a display portion pivotally coupled to a base portion. The display portion can carry a magnetic element (referred to hereinafter as a triggering magnetic element) that provides a triggering magnetic field that can be detected by a magnetic sensor carried in the base portion (or vice versa). The magnetic sensor can be in communication with a processor or other such device. In this way, the magnetic sensor can provide information to the processor that can be used by the processor to alter an operation of the electronic device. Since a magnetic field strength of the triggering magnetic field provided by the triggering magnetic element varies inversely with a distance from the magnetic element, the magnetic field strength can provide an indication of a distance between the triggering magnet and the magnetic sensor. Accordingly, when the triggering magnetic field strength detected by the triggering magnetic sensor is greater or less than a threshold value indicative of a relative positioning of the triggering magnetic element and the magnetic sensor, the magnetic sensor can send an appropriate detection signal to the processor. The processor can, in turn, cause the laptop to operate in a manner consistent with information carried by the detection signal. For example, when the magnetic sensor detects that the triggering magnetic field strength is increasing/crossing the threshold value, the detection signal can provide information to processor that indicates that the display portion is moving towards the base portion. The processor can, in turn, deduce that the laptop is transitioning from an open to a closed configuration and alter the operation of the laptop by, for example, putting the laptop to sleep.

It is clear then that proper functioning of the magnetic sensor system relies upon the magnetic sensor detecting, with a high degree of confidence, only the triggering magnetic field. If, however, the magnetic sensor is detecting other than the triggering magnetic field, then a spurious detection signal can be provided to the processor that can act upon the spurious detection signal causing what can be referred to as a false trigger event, or more simply, false triggering. The false trigger event can be described in terms of the processor causing the electronic device to take actions that are inappropriate in the context of a current configuration of the electronic device. For example, when the laptop computer is physically in the open configuration and the magnetic sensor detects the spurious magnetic field having a spurious magnetic field strength greater than the threshold value (and increasing), the detection signal can cause the processor to provide an instruction that results in the laptop entering an operating state consistent with the laptop in the closed configuration (such as a sleep mode) even though the laptop is in reality in the open configuration and operating accordingly.

According to one embodiment, in order to prevent false triggering, a relationship between the magnetic sensor and the triggering magnetic element (and more specifically, the triggering magnetic field) can be such that the magnetic sensor will, with a high confidence, only be able to detect the threshold value of the triggering magnetic field to the exclusion of magnetic elements other than the triggering magnetic element. This relationship can be a spatial relationship, a relationship between physical properties of the triggering magnetic element and associated detection properties of the magnetic sensor, and so forth. For example, in one embodiment, a magnetic sensor can be arranged in a manner that selectively targets a specific portion of the triggering magnetic field generated by the triggering magnetic element. In order to more clearly describe this relationship, a magnetic sensor can be described in terms of having a detection axis that represents a direction that the magnetic sensor is most sensitive to a magnetic field. Accordingly, the magnetic sensor can have a maximum sensitivity to a magnetic field having field lines that are parallel to the detection axis and can be generally less sensitive to any off-axis magnetic fields having field lines that are not generally parallel to the detection axis. By way of example, a Hall effect sensor can have a detection axis that is orthogonal to a surface of the sensor's magnetic sensing element. Also, a magneto-resistive sensor can have a detection axis that is fixed with respect to an alignment of the sensor's conductive magnetic sensing element. In the case of an anisotropic magneto-resistive (AMR) sensor, the detection axis can be along the direction of current that flows through the conductive magnetic sensing element.

By properly positioning and aligning the detection axis of a magnetic sensor relative to the magnetic field of the triggering magnetic element, the magnetic sensor can selectively target a specific portion of the magnetic field generated by the triggering magnetic element when the triggering magnetic element is brought within range of a triggering position (i.e. the spatial relationship between the triggering magnetic element and the threshold value). For example, the magnetic field lines can be described in terms of having both horizontal and vertical components where field lines at either pole of the magnetic element are essentially orthogonal to the magnetic pole surface. The field lines then wrap around the magnetic element from one magnetic pole to the other and can therefore be characterized as having both horizontal and vertical components. In one case, the magnetic sensor can be oriented, shaped, or positioned with respect to the triggering magnetic element in a manner that precludes detection of other than the triggering magnetic field within a distance corresponding to a detection distance. For example, the magnetic sensor can be arranged such that it is sensitive to only a horizontal component of the triggering magnetic field, the magnetic sensor can become much less likely to encounter a false triggering field.

It should be noted that triggering magnetic elements in the described embodiments can be permanent magnets such as magnetized iron, ceramic rare earth magnets such as samarium-cobalt, neodymium, or other rare earth alloy magnets. The triggering magnetic elements can also be any magnetic elements that can generate a magnetic field such as any electromagnets. The magnetic sensors can be Hall effect sensors, anisotropic magneto-resistive (AMR) sensors, giant magneto-resistive (GMR) sensors, tunnel magneto-resistive (TMR) sensors, other magneto-resistive sensor or any suitable magnetic sensors. Sensors such as magneto-resistive sensors may be particularly sensitive, and as such can detect differences in a magnetic field where the field is rotated by as little as 0.5 degrees. The detection axis for those sensors can be precisely oriented in a manner described in further detail below.

The magnetic sensor systems described herein can be used with any suitable electronic devices and electronic accessories, such as those sold by Apple Inc. of Cupertino, Calif.

These and other embodiments are discussed below with reference to FIGS. 1-14; however, those skilled in the art will readily appreciate that the detailed description given herein with respect to these figures is for explanatory purposes only and should not be construed as limiting.

FIG. 1 shows a perspective view of representative electronic device 100 in accordance with some embodiments. In some embodiments, the electronic device 100 can be a portable electronic device such as a laptop computer device. In other embodiments, the electronic device 100 can be a portable electronic device that takes the form of, for example, a smartphone, or a tablet.

The electronic device 100 can include a first portion such as base portion 102 and a second portion such as a display portion 104. The base portion 102 can include a housing 106 that carries various integrated circuit chips and other circuitry (not shown) that provide computing operations for electronic device 100. For example, the integrated circuit chips and other circuitry may include a motherboard, microprocessors, read-only memory, random-access memory, hard drives, batteries, and various input/output support devices. On top surface 108 of housing 106, there can be various user input devices such as a keyboard 110 and a trackpad 112 that are electrically coupled to the internal circuitry for users to control electronic device 100. On each side of the trackpad 112, housing 106 can provide two generally flat arm rest areas 114. Housing 106 can also include a pair of speakers 116 located on top surface 108 at each side of keyboard 110.

The housing 106 of the base portion 102 can be formed from a metal, such as aluminum or an alloy that includes aluminum. However, other materials are possible, such as a rigid plastic or ceramic.

Referring now to the display portion 104, it can include a housing 118, a bezel 120, and a display device 122 on surface 124. Housing 118 and bezel 120 can cooperate to form a cavity that carries the display device 122. Housing 118 and the bezel 120 can be formed from the same material as the housing 106 of the base portion 102 to give a coherent and aesthetic appearance to the electronic device 100. In one case, display portion 104 can have surface 124 that is generally in the same shape and size as top surface 108 of the base portion 102. Display device 122 can at least partially faces the surface 106.

The display portion 104 can be pivotally coupled to base portion 102 via a hinge 126. Hence, display portion 104 can rotate to different positions relative to base portion 102. The relative angle between display portion 104 and base portion 102 is marked as angle θ in FIG. 1 that can vary from about 0° in the closed configuration to greater than 90° in the open configuration. In the closed configuration, surface 124 of display portion 104 can come into contact with surface 108 of base portion 102 and the angle θ becomes zero degrees or close to zero degrees. In other words, display portion 104 can lie on or is just above the top surface 108 of base portion 102 such as display 122 and the user input devices such as keyboard 110 and trackpad 112 are covered. Hence, in the closed configuration, surface 106 and surface 124 can be at least in close proximity and can be generally parallel to each other. The closed configuration can also be referred to an inactive configuration or a folded configuration. In the open configuration, such as the particular configuration shown in FIG. 1, display portion 104 can be visible and the user input devices such as keyboard 110 and trackpad 112 can be accessible. The open configuration can usually be a normal operating configuration for electronic device 100. The open configuration can also be referred to an operating configuration or an unfolded configuration. Normally, users may adjust the angle θ of the display portion 104 relative to the base portion 102 in the open configuration to suit their preference of display orientation.

In terms of operation, the electronic device 100 can be switched between different modes (i.e. different operational states) including at least an inactive mode, such as a sleep mode, and an active mode. In the inactive mode, the electronic device 100 can enter a state of low energy use that draws minimum amount of power or substantially no power. Display 122 is usually turned off in the inactive mode. In one case, the sleep mode can even include a complete shut down of electronic device 100. In the active mode, electronic device 100 can operate normally and can usually be associated with the open configuration. However, electronic device 100 can also be manually turned off or put to a sleep mode even if electronic device 100 is in the open configuration.

Still referring to FIG. 1, electronic device 100 can further include a single magnetic sensor system or multiple magnetic sensor systems. A first magnetic sensor system can include a triggering magnetic element 128 carried by display portion 104 near right side edge 130 of display portion 104 at a distance D1 from right side edge 130. Preferably, triggering magnetic element 128 can be embedded inside the display portion 104 so that triggering magnetic element 128 is not visible to users but directs a triggering magnetic field having horizontal magnetic field components penetrating through the wall of housing 118 of display portion 104. The first magnetic sensor system can further include a magnetic sensor 132 carried by base portion 102 near right side edge 134 of base portion 102 at a distance D2 from right side edge 134. Preferably, magnetic sensor 132 can be housed inside base portion 102 and be carried by an internal circuit such as the motherboard of electronic device 100 or a board that is in communication with the motherboard. Triggering magnetic element 128 generates the triggering magnetic field and is oriented such that an appropriate aspect (such as the horizontal components) of the triggering magnetic element 128 can trigger magnetic sensor 132 when triggering magnetic element 128 is bought in proximity to magnetic sensors 132. As such, when magnetic sensor 132 is triggered by detecting the appropriate aspect of the triggering magnetic field in relation to a relevant threshold value, magnetic sensor 132 can send a detection signal representing such detection status to a processor or other such device that can deduce that electronic device 100 is brought into the closed, or nearly closed, configuration. In turn, the processor can initiate an inactive mode when it receives such signal from the magnetic sensor. Hence, electronic device 100 can automatically turn to the inactive mode such as a sleep mode when a user brings the electronic device 100 into the closed configuration. Conversely, when display portion 104 is brought away from base portion 102, triggering magnetic element 128 is accordingly also brought away from the detection distance of magnetic sensor 132. In turn, magnetic sensor 128 is no longer triggered and another signal representing a detection status of de-triggering of the sensor can be sent to the processor, which can in turn deduce that electronic device 100 is brought into an open configuration. It should also be noted that a lack of the detection signal may also indicate to the processor that the magnetic sensor is no longer detecting the triggering magnetic field.

In some cases, electronic device 100 may include additional magnetic sensor systems that are associated with deducing the closed configuration of electronic device 100. For example, in the particular arrangement shown in FIG. 1, electronic device 100 shows a second set of magnetic sensor system that can be located near an opposite side of where the first set of magnetic sensor system is located. The second magnetic sensor system can include a second triggering magnetic element 136 carried by display portion 104 near left side edge 138 of display portion 104 at a distance D3 from left side edge 138. Similar to triggering magnetic element 128, second triggering magnetic element 136 preferably can be embedded inside the display portion 104 so that triggering magnetic element 136 is not visible to users but directs a magnetic field that penetrates through the wall of housing 118 of display portion 104. The second magnetic sensor system can further include a second magnetic sensor 140 carried by base portion 102 near left side edge 142 of base portion 102 at a distance D4 from left side edge 142.

Similar to magnetic sensor 132, second magnetic sensor 140 can be housed inside base portion 102 and be carried by an internal circuit such as the motherboard of electronic device 100 or a board that is in communication with the motherboard. The second set of magnetic sensor system cooperates with the first set of magnetic sensor system to confirm that electronic device 100 is in a particular configuration, such as a closed configuration, in a manner that will be described in further detail below. In one case, a processor may transition electronic device 100 to an inactive mode when the processor concurrently receives signals from both sensors, each signal indicating that the sensor is triggered. In another case, the processor may transition electronic device 100 back to an active mode when both sensors indicates that they are no longer triggered. In yet another case, electronic device 100 may remain in the current mode when the processor receives a signal from one sensor indicating the sensor is triggered but another signal from a second sensor indicating the second sensor is not triggered.

While FIG. 1 shows that the two magnetic sensor systems are located at two sides of electronic device 100 at certain relatively symmetric positions, those skilled in the art would understand that the locations of the magnetic sensor systems are not limited to those locations. Also, while it is described that the magnetic sensors can be located in the base portion while the triggering magnetic elements can be located in the display portion, those skilled in the art would understand that the positions of the magnetic sensors and the triggering magnetic elements can be interchanged in some embodiments.

Figure 2:
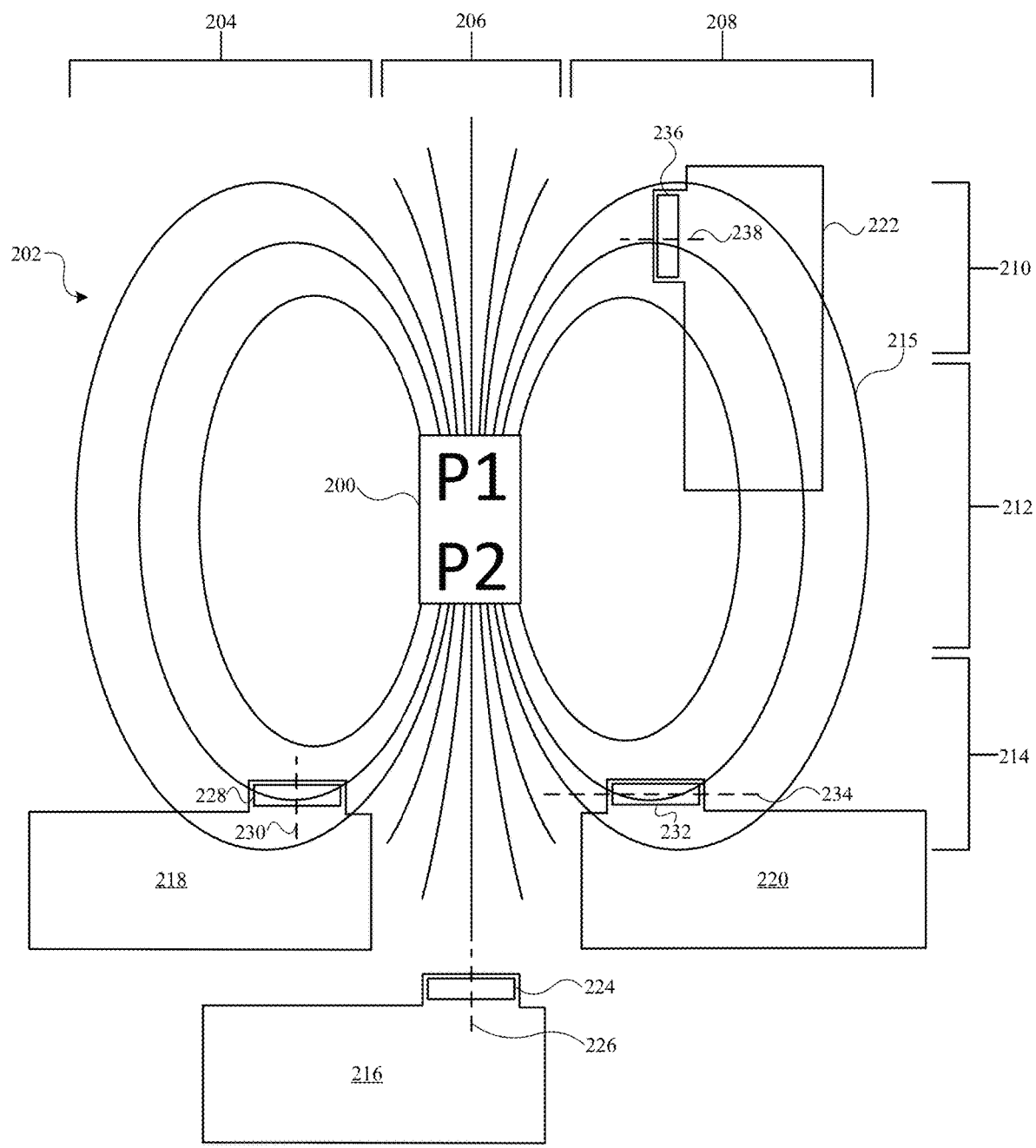
FIG. 2 illustrates different magnetic sensors in different positions relative to a magnetic element.

FIG. 2 illustrates relationships among magnetic sensors and a magnetic element when the magnetic element is brought near a detection distance of the magnetic sensors. Representative magnetic sensor system arrangements shown in FIG. 2 each having a specific spatial relationship with triggering magnetic element 200 having magnetic polarity P1 and P2.

Referring first to the triggering magnetic element 200, triggering magnetic element 200 can have a P1-P2 polarity alignment along a direction that can be generally referred to as a vertical direction. Triggering magnetic element 200 can generate a triggering magnetic field 202 that exerts influence most significantly on the space near triggering magnetic element 200. For illustration purposes, the space near triggering magnetic element 200 is labeled vertically by regions 204, 206 and 208 and horizontally by regions 210, 212, and 214.

In general, magnetic field 202 can be represented in terms of its field lines. The magnetic field lines can be described in terms of having both horizontal and vertical components where field lines at either pole of the magnetic element are essentially orthogonal to the magnetic pole surface. The field lines then wrap around the magnetic element from one magnetic pole to the other having both horizontal and vertical components. For example, one of the field lines 215 can first travel generally vertically away from triggering magnetic element 200 in central region 206, turn generally horizontal across region 210 away from triggering magnetic element 200, turn vertical again along the outskirt of region 210 across region 212, then turn horizontal again near region 214 towards triggering magnetic element 200, and finally turn vertical again in central region 206 to return to the magnetic element to form a closed loop. Near triggering magnetic element 200, some areas, such as area along central region 206, can experience strong vertical component of triggering magnetic field 202 while other areas can experience strong horizontal component of triggering magnetic field 202. For example, triggering magnetic field 202 can exhibit the most concentrated vertical component in the central region 206 that is along and extended from the polarity alignment of triggering magnetic element 200. Magnetic field 202 can also exhibit some vertical components in the region 212 but is generally weaker than region 206 because the field lines diverge. Magnetic field 202 can exhibit strong horizontal components in the regions 204 and 208 near regions 210 and 214.

It should be noted that the directions described in FIG. 2 are relative to the orientation of the polarity alignment of triggering magnetic element 200. Hence, a component of magnetic field being described as vertical is with respect to the polarity alignment of triggering magnetic element 200. But a magnetic element can be oriented in any direction and does not have to be orientated or positioned in fact vertically in a three-dimensional space. Similarly, a horizontal direction is also relative to the polarity alignment of the magnetic element.

Now referring to the spatial arrangements among the magnetic sensors and triggering magnetic element 200, magnetic sensors 216, 218, 220, and 222 can have different positions and/or orientations relative to triggering magnetic element 200. Each magnetic sensor can also have a different orientation of detection axis relative to the orientation of the magnetic sensor and relative to triggering magnetic field 202. For example, a first exemplary magnetic sensor 216 can include magnetic sensing element 224 having a detection axis 226 that can be generally orthogonal to the orientation of magnetic sensor 216. Because magnetic sensor 216 is positioned horizontally relative to the polarity alignment of triggering magnetic element 200, detection axis 226 can target vertical component of triggering magnetic field 202. In terms of the spatial relationship, magnetic sensor 216 can be positioned along an extension of the polarity alignment of triggering magnetic element 200. Similar to the first exemplary magnetic sensor 216, a second exemplary magnetic sensor 218 can also include magnetic sensing element 228 having a detection axis 230 that can be generally orthogonal to the orientation of magnetic sensor 218 so that the detection axis 230 can target vertical component of triggering magnetic field 202. Unlike the first exemplary magnetic sensor 216, second exemplary magnetic sensor 218 is positioned off-axis from the polarity alignment of triggering magnetic element 200, meaning magnetic sensor 218 is not located at a position that is generally along the extension of the polarity alignment of triggering magnetic element 200. A third exemplary magnetic sensor 220 can include magnetic sensing element 232 having a detection axis 234 that is generally parallel to the orientation of magnetic sensor 220. Since magnetic sensor 220 can be orientated horizontally relative to the polarity alignment of triggering magnetic element 200, magnetic sensing element 232 can target horizontal component of triggering magnetic field 202. In terms of the spatial relationship, magnetic sensor 220 can be located at a region that shows strong horizontal component of magnetic field 202, such as region 208 near region 214. A fourth exemplary magnetic sensor 222 can also be located at a region that shows strong horizontal component of magnetic field 202, such as region 208 near region 210. Unlike the third exemplary magnetic sensor 220, the fourth exemplary magnetic sensor 222 can include magnetic sensing element 236 having a detection axis 238 that is generally orthogonal to the orientation of magnetic sensor 222. Since magnetic sensor 222 is orientated vertically, magnetic sensing element 236 can also target horizontal component of magnetic field 202.

The targeting of vertical component of triggering magnetic field 202 for magnetic sensor 216 may subject magnetic sensor 216 to significant magnetic interference when the system is employed in an electronic device. Advances in technology make it rather common for an electronic device to be placed near other electronic devices such as some loudspeakers and mobile phones. It has also become rather common for other electronic devices to include different kinds of magnets, some of which can be quite powerful. Many of those magnetic elements can have a polarity alignment that is in fact positioned vertically when the electronic device is placed horizontally. For example, a loudspeaker can have a rather power magnet that is positioned upright and when the loudspeaker is placed on a horizontal surface such as a table. A mobile phone can also have a magnet that is aligned vertically when the mobile phone lies horizontally on a surface. When magnetic sensor 216 that has a detection axis 226 targeting vertical component of triggering magnetic field 202 is installed in an electronic device, magnetic sensor 216 may be interfered by vertical components of various ambient but spurious magnetic fields. In some situations, a spurious magnetic field can even falsely trigger the magnetic sensor 224. If the triggering of the magnetic sensor 216 is associated with a sleep mode, the detection signal triggered by a spurious magnetic field can cause the processor to provide an instruction that results in the electronic device entering the sleep mode even though the laptop is in reality in the open configuration and operating accordingly. For example, a user may place mobile phone on an arm rest area of the electronic device under which magnetic sensor 216 is located. In some situations if the mobile phone has a sufficiently powerful magnet, it may falsely trigger sensor 224.

Now turning to magnetic sensor 218, the spatial arrangement of magnetic sensor 218 relative to magnetic element 200 illustrates that a magnetic sensor targeting the vertical component of a triggering magnetic field may not be properly triggered when the sensor is off-axis from the polarity alignment of the triggering magnetic element. Generally, each magnetic sensor is calibrated to have a triggering threshold. A detect magnetic strength below such threshold may not trigger the magnetic sensor. As shown in FIG. 2, even though magnetic sensor 218 is located at a position that is under the influence of magnetic field 202, magnetic sensor 218 has a detection axis 230 that targets vertical component of magnetic field 202 but strong horizontal component and weak vertical component of magnetic field 202 is exhibited at where magnetic sensor 218 is located. Hence, vertical component of magnetic field 202 at the location of magnetic sensor 218 may not be strong enough to cross the triggering threshold of magnetic sensor. This shows that, in order for a magnetic sensor to be properly triggered by a triggering magnetic element, the magnetic sensor should be positioned spatially at a specific location relative to the triggering magnetic field. In addition, the triggering magnetic field passing through the magnetic sensor should also be significantly parallel to the detection axis of the magnetic sensor.

Still referring to FIG. 2, magnetic sensor 220 illustrates both a spatial and a physical relationship between a magnetic sensor and triggering magnetic element 200 such that magnetic 220 will, with a high confidence, only be able to detect the threshold value of the triggering magnetic field 202 to the exclusion of other potential spurious magnetic fields in accordance with an embodiment. As illustrated in FIG. 2, magnetic sensor 220 can have a detection axis 234 oriented in a manner that selectively targets horizontal component of the triggering magnetic field 202 and magnetic sensor 220 can be spatial arranged at a position that has dense horizontal component of magnetic field 202 and, at the same time, avoid the vertical component. Put differently, the detection axis 234 can be parallel to the body of the magnetic 220 and also be generally parallel to the horizontal component of triggering magnetic field 202. Spatially, magnetic sensor 220 can be positioned within the region 208 and detects field lines that have turned horizontal. Hence, when triggering magnetic element 200 is within the detection distance of magnetic sensor 232, magnetic sensor 232 can, thus, detect a threshold value of a magnetic strength of horizontal component of magnetic field 202. Based on these specific relationships, magnetic sensor 220 can detect whether magnetic element 200 is within a detection distance with a high degree of confidence.

Similarly, in accordance with another embodiment, magnetic sensor 222 can also detect a threshold value of a magnetic strength of horizontal component of magnetic field 202. Even though magnetic sensor 222 has a detection axis 238 that is orthogonal to the magnetic 222, magnetic sensor 222 can be positioned upright. As such, magnetic sensor 222 can also be used to detect whether the triggering magnetic element 200.

By selectively targeting a specific portion of the triggering magnetic field generated by the triggering magnetic element, a magnetic sensor can, with a high degree of confidence, detect the threshold value of the triggering magnetic field to the exclusion of magnetic elements other than the triggering magnetic element when the magnetic sensor system is employed in an electronic device. In a three-dimensional space where different electronic devices are placed relative to horizontal surfaces (such as on a table or a floor), there is a single vertical direction but there are many different non-parallel horizontal directions. By targeting magnetic field that has a specific horizontal direction, system such as magnetic sensor 220 can significantly reduce chances of potential false triggering by any ambient spurious magnetic fields.

Figure 3A:
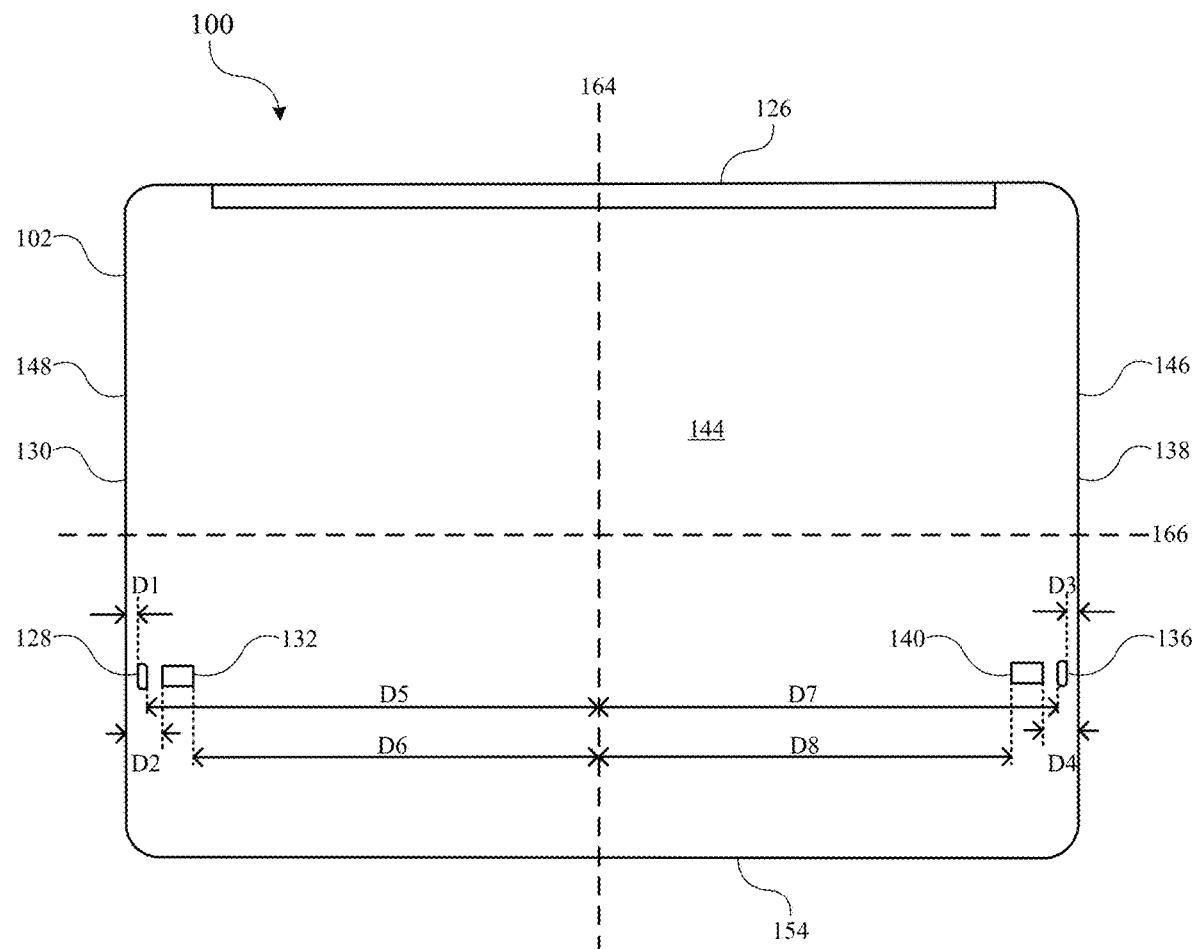
FIG. 3A illustrates a bottom view of the electronic device shown in FIG. 1.
Figure 3B:
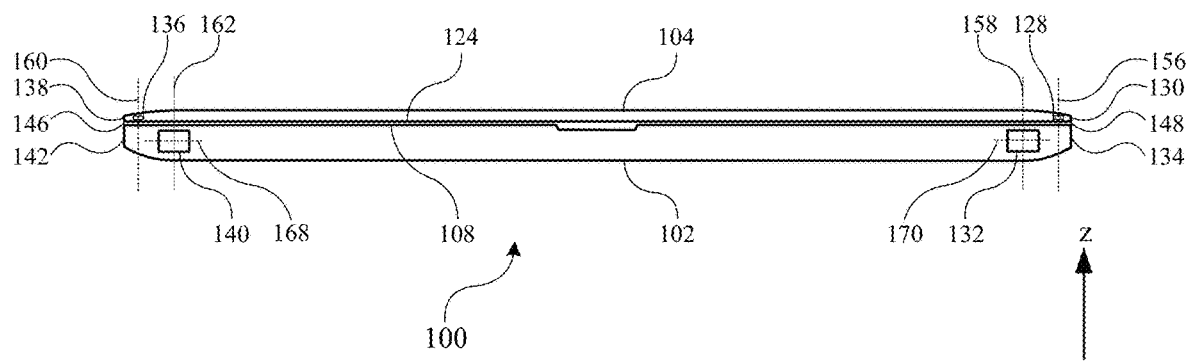
FIG. 3B illustrates a front view of the electronic device shown in FIG. 1.

Referring to FIGS. 3A and 3B, the figures illustrate how triggering magnetic elements can be positioned spatially relative to their corresponding magnetic sensors with the reference of an electronic device in a closed configuration in accordance with a described embodiment. FIG. 3A is a bottom view of electronic device 100 showing the base portion 102 and the hinge 126. Since it is a bottom view, the components appeared in FIG. 3A can be in left-right reversed positions as compared to FIG. 1 and FIG. 3B. FIG. 3B shows a front view of electronic device 100 that can have display portion 104 in close proximity with base portion 102 in a closed configuration.

In one case, the surface of display portion 104 can have a generally same shape and size as base portion 102. Hence, when electronic device 100 is in a closed configuration, display portion 104 can generally lie over or is just above base portion 102. The surface 106 of base portion 102 and the surface 124 of display portion 104 can be at least in close proximity and be generally parallel to each other. As such, the edges of display portion 104 and the edges of base portion 102 can come in contact and be generally parallel to each other in the closed configuration. For example, left side edge 138 of display portion 104 and left side edge 142 of base portion 102 can generally overlap and form a common left edge 146. Right side edge 130 of display portion 104 and right side edge 134 of base portion 102 can generally overlap and form a common right edge 148.

FIG. 3A shows a bottom surface 144 that can be generally opposite the top surface 108 that holds user input devices such as trackpad 112 and keyboard 110 shown in FIG. 1. As shown, the triggering magnetic element and its corresponding magnetic sensor may not be aligned on the same axis in the closed configuration. Instead, the triggering magnetic element can be positioned laterally off-axis or offset from the magnetic sensor. For example, triggering magnetic element 128 can be located at a position that has a nearest distance D1 from right edge 130 (or from common right edge 148) but magnetic sensor 132 can be located at a position that has a nearest distance D2 from right edge 134 (or from common right edge 148). Distance D1 and distance D2 can be different so that triggering magnetic element 128 can be positioned offset from magnetic sensor 132. In this particular case, distance D2 can be larger than distance D1. Similarly, magnetic element 136 can be located at a position that has a nearest distance D3 from left edge 138 (or from common left edge 146) but magnetic sensor 140 can be located at a position that has a nearest distance D4 from left edge 138 (or from common left edge 146). Distance D3 and distance D4 can be different so that magnetic element 136 can be positioned offset from magnetic sensor 140. In this particular case, distance D4 can be larger than distance D3.

Described differently in terms of the relative positions of the triggering magnetic element and the magnetic sensor viewed from the front (i.e. FIG. 3B), a triggering magnetic element can be positioned along a first imaginary axis along the z-direction, which is a direction that is generally orthogonal to surface 144 or generally along the vertical direction when electronic device lies on a horizontal surface. And a magnetic sensor can be positioned along a second imaginary axis along the z-direction. The second imaginary axis is displaced from the first imaginary axis and does not overlap the first imaginary axis. For example, triggering magnetic element 128 can be located at a position along imaginary axis 156 while magnetic sensor 132 can be located at a position along imaginary axis 158 so that triggering magnetic element 128 can be positioned offset from magnetic sensor 132. As shown in FIG. 3B, imaginary axis 156 is laterally displaced from imaginary axis 158 and does not overlap imaginary axis 158. Similarly, triggering magnetic element 136 can be located at a position along imaginary axis 160 while magnetic sensor 140 can be located at a position along imaginary axis 162. And imaginary axis 160 is displaced from imaginary axis 162 and does not overlap imaginary axis 162 so that triggering magnetic element 136 can be positioned offset from magnetic sensor 140. Moreover, magnetic sensor 140 can have a detection axis 168 that is generally orthogonal to the z-direction and magnetic sensor 132 can have a detection axis 170 that is also generally orthogonal to the z-direction. Put differently, detection axis 168 and detection axis 170 can be generally parallel to surface 108. As such, magnetic sensors 132 and 140 can detect a threshold value of a magnetic strength of horizontal components of triggering magnetic field generated by triggering magnetic elements 128 and 136.

The relative positions of the triggering magnetic element and the magnetic sensor can also be described in terms of a centerline of electronic device 100. FIG. 3A also shows an imaginary line 164 along a first direction. Imaginary line 162 is roughly a centerline of electronic device 100 that divides electronic device 100 into two half along a second direction represented by line 166. Triggering magnetic element 128 can be located at a position that has a nearest distance D5 from centerline 164 and magnetic sensor 132 can be located at a position that has a nearest distance D6 from centerline 164. Distance D5 can be different from distance D6 so that triggering magnetic element 128 can be positioned laterally offset from magnetic sensor 132. Similarly, triggering magnetic element 136 can be located at a position that has a nearest distance D7 from centerline 164 but magnetic sensor 140 can be located at a position that has a nearest distance D8 from centerline 164. Distance D7 can be different from distance D8 so that triggering magnetic element 136 can be positioned laterally offset from magnetic sensor 140. In some cases, the dimension of a first portion of an electronic device can be different than the dimension of a second portion. The relative positions of the sensors and the triggering magnetic elements can be described relative to the centerline.

While FIGS. 3A and 3B show that the triggering magnetic elements can be displaced from their corresponding magnetic sensors along a certain direction, those skilled in the art would understand that the displacement or offset does not have to be along a direction parallel to line 164. It can be along any directions. For example, the triggering magnetic elements can be laterally displaced or laterally offset from their corresponding magnetic sensors relative to centerline 166 or relative to front edge 154. In some cases, the triggering magnetic elements can be laterally displaced from their corresponding magnetic sensors in a diagonal direction. At bottom, a triggering magnetic element can be located in display portion 104 at an intended triggering position that is not the corresponding equivalent position where its magnetic sensor is located in base portion 102 so that the sensor can be located at position that is generally not along an extension of the polarity alignment of the magnetic element. This off-axis alignment provides advantages over the same-axis alignment shown in magnetic sensor 216 of FIG. 2 because it can significantly reduce the chance of false triggering of the magnetic sensor.

Figure 4A:
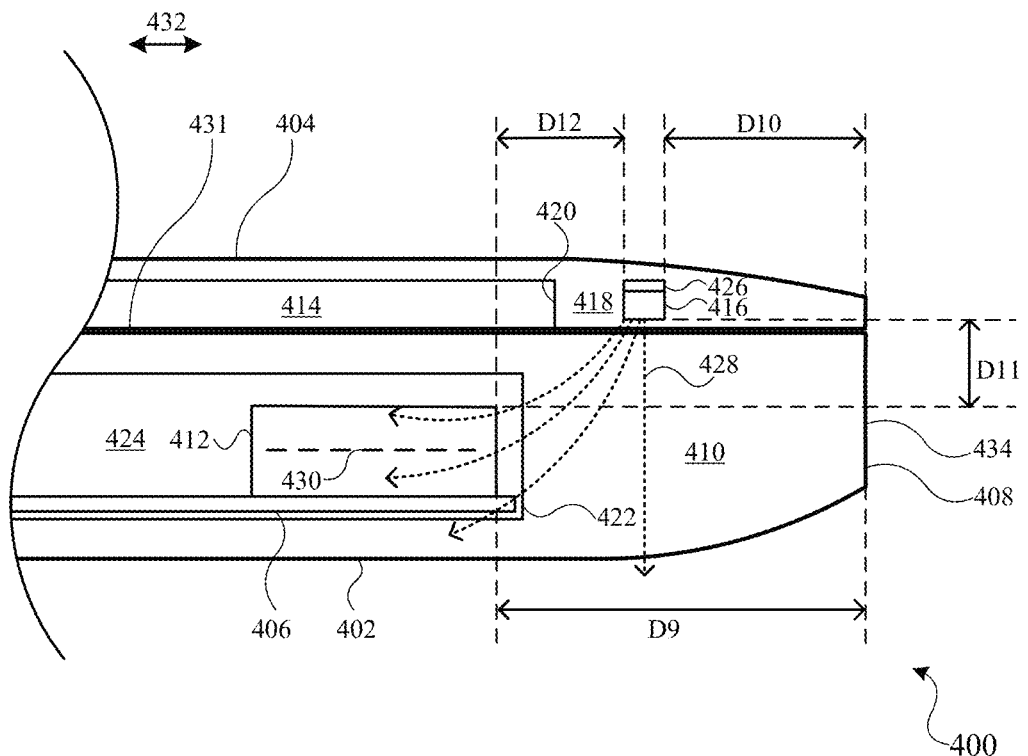
FIG. 4A illustrates an enlarged partial view of an electronic device showing the relative positions of a magnetic element and a magnetic sensor in accordance with an embodiment.

FIG. 4A is an enlarged partial plan view of a right side of an electronic device 400 in accordance with a described embodiment. FIG. 4A illustrates several advantages of having a magnetic sensor that specifically targets horizontal component of a triggering magnetic field.

In FIG. 4A, electronic device 400 is in a closed configuration such that a first portion 402 can be can be in contact or near in contact with a second portion 404. First portion 402 can be a base portion that carries internal circuitry such as a circuit board 406. Circuit board 406 can be the motherboard of electronic device 400 or a board that is electrically coupled to and in communication with the motherboard. To provide structural rigidity to electronic device 400, housing 408 can have a relatively thick wall 410 to protect the internal circuitry from impacts. A magnetic sensor 412 can be carried by circuit board 406.

Second portion 404 can be a display portion that carries a display device 414 and a triggering magnetic element 416 embedded in the housing 418 of second portion 404. To maximize the size of display device 414, the right most part 420 of display device 414 can go beyond the right most part 422 of cavity 424 of base portion 402. As shown in FIG. 4A, magnetic sensor 412 can be positioned off-axis from triggering magnetic element 416, this arrangement allows the display device 414 be maximized without affect the structural rigidity of base portion 402 and at the same time allows magnetic sensor 412 be placed directly on motherboard 406.

Triggering magnetic element 416 can have a magnetic shunt 426 that can be formed of ferromagnetic materials. The magnetic shunt 426 can be positioned behind triggering magnetic element 416 so that it directs a magnetic field represented by field lines 428 generated by triggering magnetic element 416 towards magnetic sensor 412. When electronic device 400 is in its closed configuration (i.e. triggering magnetic element 416 is brought within or near detection distance), triggering magnetic element 416 can have a polarity alignment that is generally along the z-direction.

Magnetic sensor 412 can include a detection axis 430 that is generally parallel to arrow 432. In other word, magnetic sensor 412 is most sensitive to magnetic fields that are in a direction represented by arrow 432 and is less sensitive to other magnetic fields that are not in the direction represented by arrow 432. In terms of the relative spatial relationship, magnetic sensor 412 can be positioned at a location that is at a nearest distance D9 from right edge 434 while triggering magnetic element 416 can be positioned at a location that is at a nearest distance D10 from right edge 434. Since triggering magnetic element 416 can be located in display portion 404 while magnetic sensor 412 can be located in base portion 402, there can be a distance D11 between triggering magnetic element 416 and magnetic sensor 412 in the z-direction. In some cases, there can also be a distance D12 between triggering magnetic element 416 and magnetic sensor 412 along a horizontal direction. In other cases, triggering magnetic element 416 and magnetic sensor 412 may partially overlap. Those distances D11 or D12 allow magnetic field of triggering magnetic element 416 to turn horizontal in order to trigger magnetic sensor 412. For example, the field lines 428 can become generally along direction 432 when the field lines 428 reach the magnetic sensor 412. Hence, triggering magnetic element 416 can trigger magnetic sensor 412 in an off-axis arrangement.

It should be noted that the direction represented by arrow 432 may be a horizontal direction when base portion 402 lies on a horizontal surface. The direction represented by arrow 432 may also be a direction that is generally parallel to a surface 431 of base portion 402 on which display portion lies. The direction represented by arrow 432 may also be a direction that is generally parallel to horizontal component of the triggering magnetic field.

Figure 4B:
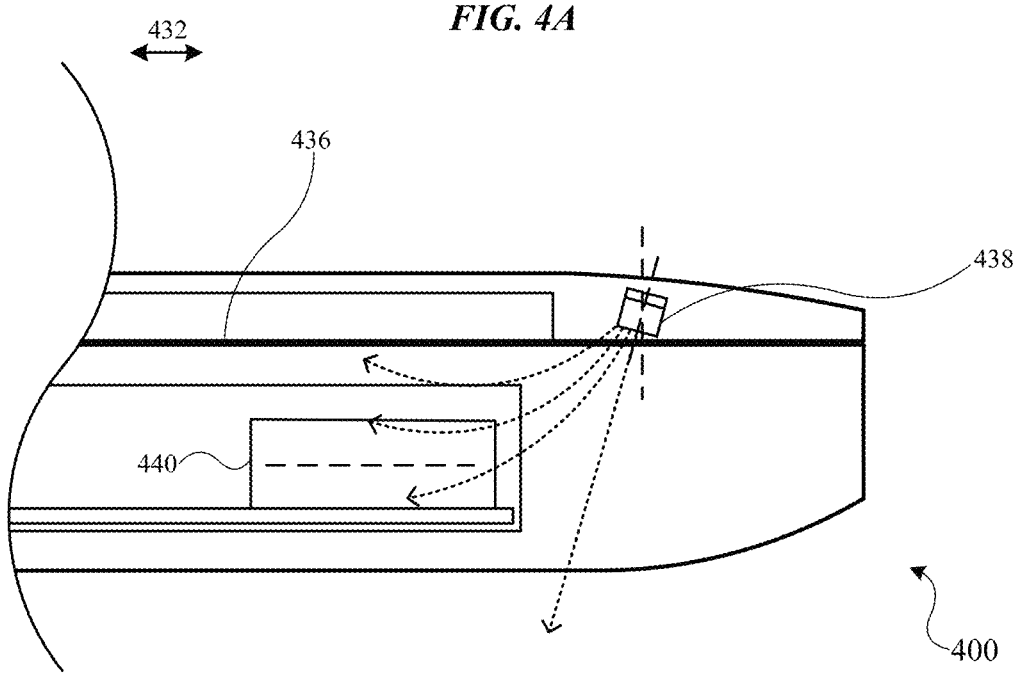
FIG. 4B illustrates another enlarged partial view of another electronic device showing the relative positions of a magnetic element and a magnetic sensor in accordance with another embodiment.

FIG. 4B shows another arrangement between a triggering magnetic element 438 and a magnetic sensor 440 in accordance with an embodiment. In this particular case, triggering magnetic element 438 can have a polarity alignment that is slightly tilted (i.e. inclined) relative to the z-direction. In other words, triggering magnetic element 416 can have a polarity alignment that is slightly tilted or inclined relative to an axis that is generally orthogonal to surface 436. The magnetic sensor 440 can have a detection axis along direction 432 so as to detect a threshold value of a magnetic strength of horizontal component of magnetic field generated by triggering magnetic element 438.

Figure 5:
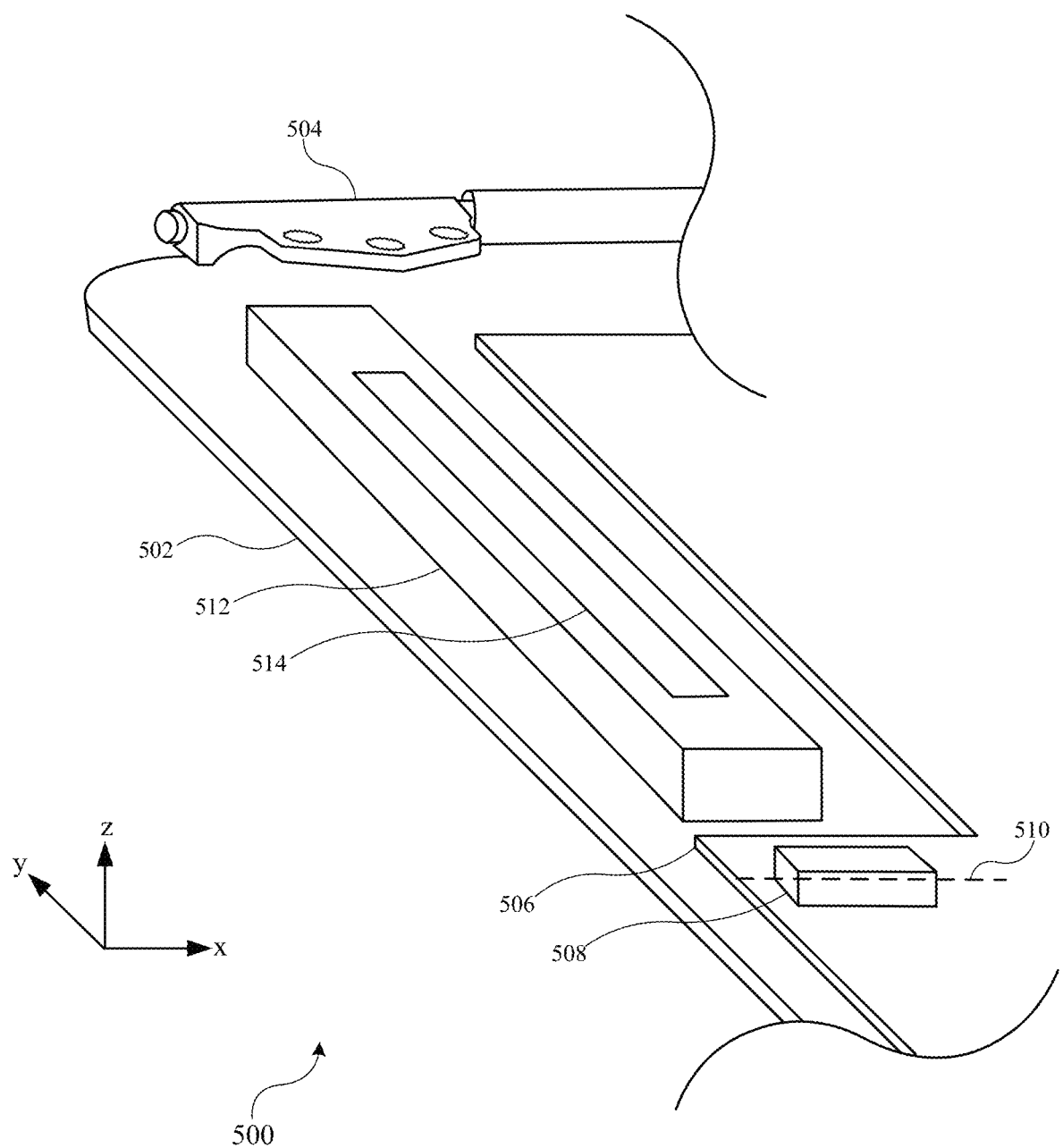
FIG. 5 is a partial internal view of a base portion of an electronic device in accordance with an embodiment.

FIG. 5 shows a partial inside view of base portion 500 of an electronic device in accordance with a described embodiment. FIG. 5 illustrates another advantage of having a magnetic sensor that targets horizontal components of a triggering magnetic field. Base portion 500 can include a housing 502 that can carry a hinge 504 that is adapted to receive a second portion of the electronic device. Housing 502 can also carry a circuit board 506 that can be the motherboard of the electronic device or a board that is electrically coupled and in communication with the motherboard. On the board 506, it can carry a magnetic sensor 508 that can have a detection axis 510 that is along the x-direction. Housing 502 can additionally carry a speaker 512 in the proximity of magnetic sensor 508. To enhance the sound quality of the electronic device, the size of the speaker 512 can be quite large compared to magnetic sensor 508. The speaker 512 can contain a relatively large magnet 514 with a strong magnetic field that can interfere with magnetic sensor 508. The magnetic field generated by the large magnet 514 may be along the z-direction when it reaches the magnetic sensor 508. Hence, a magnetic sensor 508 that targets magnetic fields along an x-direction can significantly reduce the chance of interference because the x-direction can be generally orthogonal to the z-direction. Even if some of the magnetic fields generated by magnet 514 happen to turn horizontal near magnetic sensor 508, the magnetic field will be generally along a y-direction and will not affect magnetic sensor 508. Using the sensor system described, a magnetic sensor can be placed in the proximity of and even in contact with a speaker even if a speaker is having a relatively powerful magnet.

Figure 6:
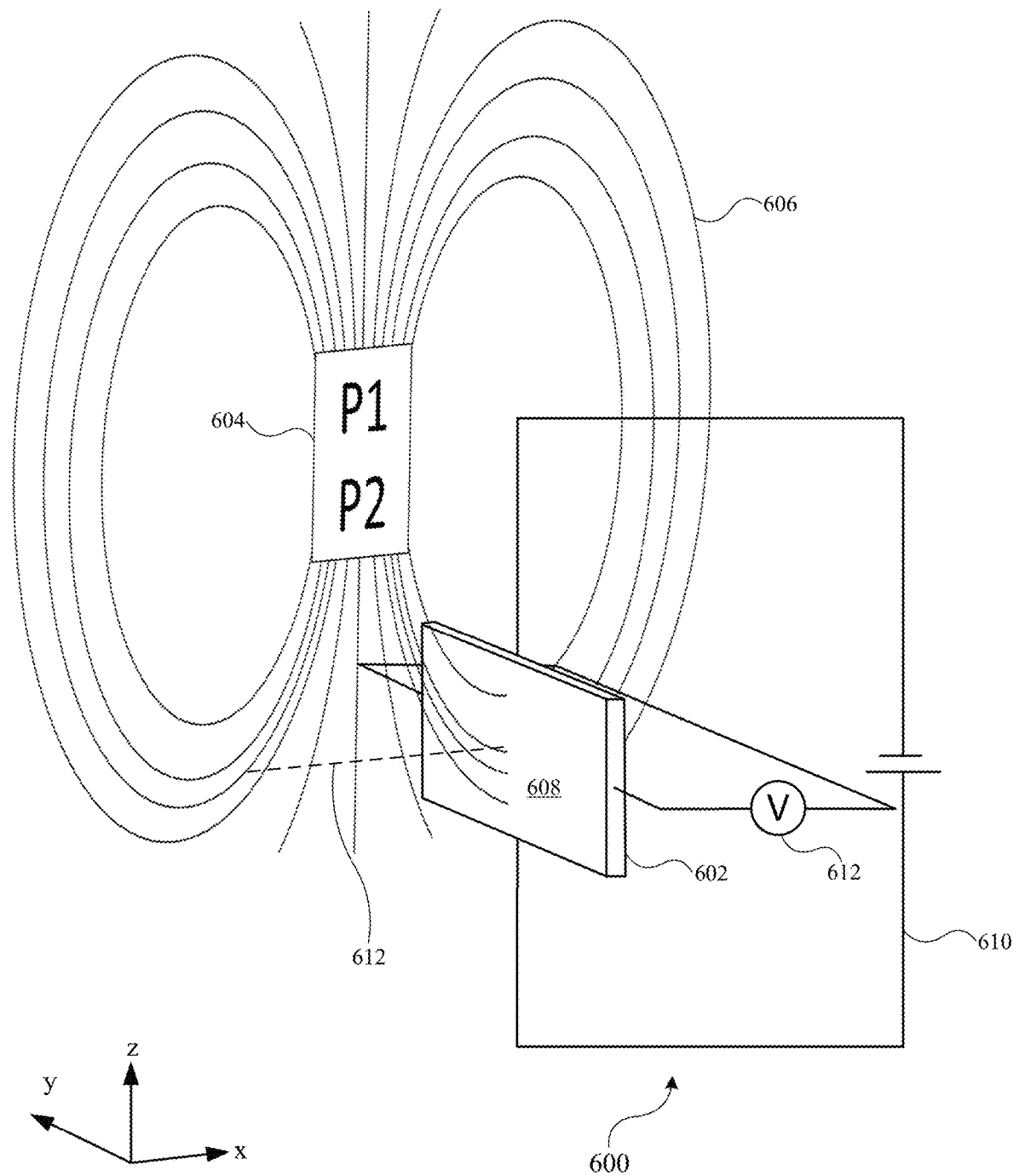
FIG. 6 illustrates a magnetic sensor in accordance with an embodiment.

FIG. 6 illustrates a magnetic sensor that can have a detection axis that targets the horizontal component of a triggering magnetic field generated by a nearby magnetic element in accordance with a described embodiment. The magnetic sensor 600 can be a Hall effect sensor that generally detects a magnetic field that is generally normal (i.e. orthogonal) to a flow of current. Magnetic sensor 600 can include a magnetic sensing element 602 that can be formed of a conductor such as a metal. As shown, magnetic sensing element 602 is spatially offset or off-axis from triggering magnetic element 604 that has a polarity alignment that is generally along the z-direction. A small current 610 can also be applied along the z-direction to magnetic sensing element 602. As the triggering magnetic field 606 reaches the surface 608 of magnetic sensing element 602, the triggering magnetic field 606 turns to a horizontal direction such as an x-direction that is generally normal to surface 608. Because magnetic sensing element 602 is simultaneously affected by the current and the triggering magnetic field 606, the triggering magnetic field 606 creates a potential difference in the magnetic sensing element 602 along a y-direction. A voltmeter 612 can be connected to the magnetic sensing element 602 along the y-direction and a voltage value can be read when a triggering magnetic element 604 is present. Hence, the magnetic sensor 600 can be triggered by triggering magnetic element 604 and have a detection axis 612 that is along the x-direction. Since the magnetic sensing element 602 senses magnetic fields that are normal to a flow of current, magnetic sensor 600 may require the current 610 to be applied along the z-direction. The magnetic sensor 600 may be positioned upright similar to magnetic sensor 222 as shown in FIG. 2. Also, a circuit board (not showing) carrying the magnetic sensor 600 may have to be vertical compared to the motherboard of the electronic device.

Figure 7:
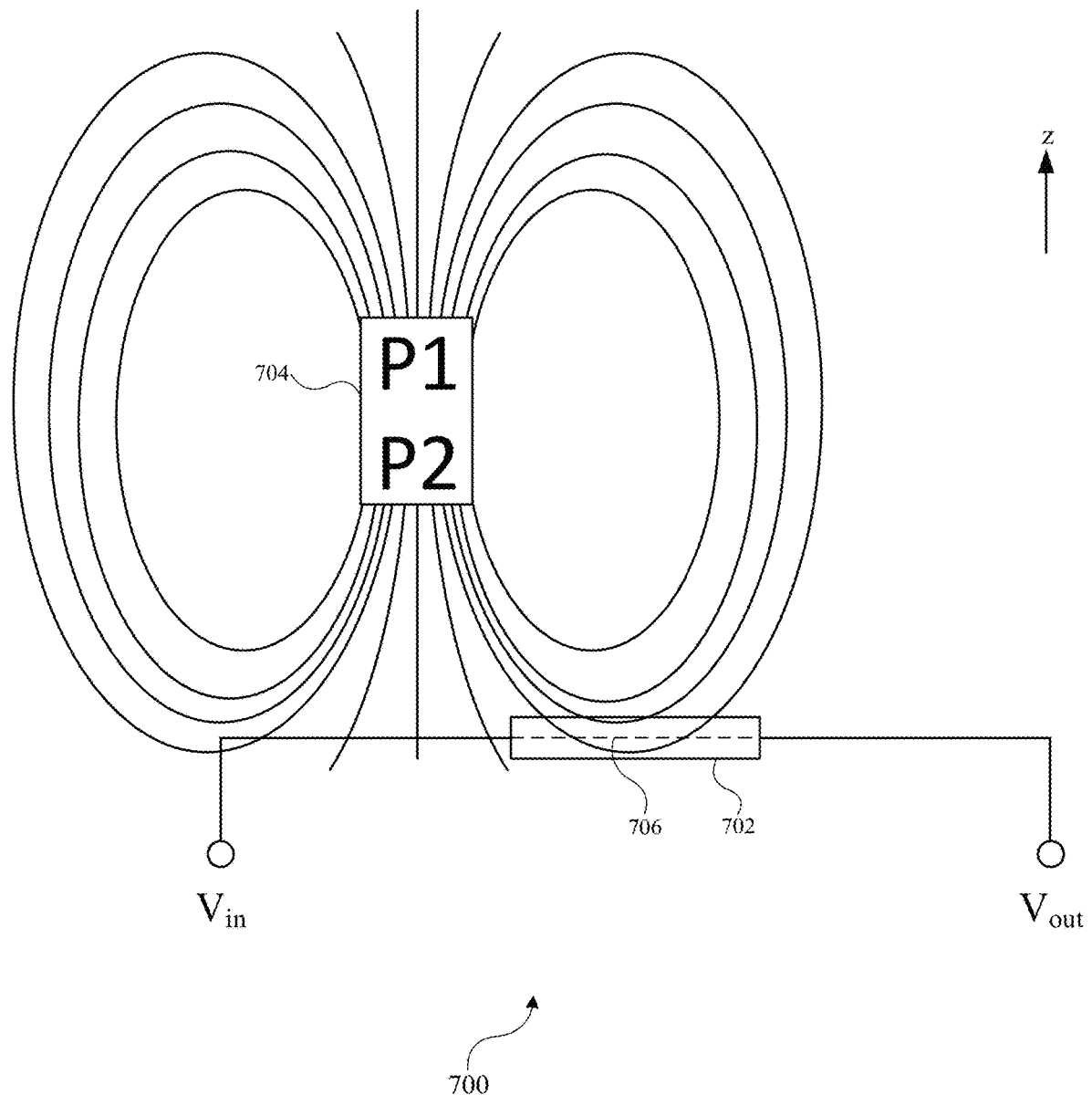
FIG. 7 illustrates another magnetic sensor in accordance with another embodiment.

FIG. 7 illustrates another magnetic sensor that can have a detection axis that targets the horizontal component of a triggering magnetic field generated by a nearby triggering magnetic element in accordance with another described embodiment. The magnetic sensor 700 can be an anisotropic magneto-resistive (AMR) sensor that generally detects a magnetic field that is parallel to a flow of current. The AMR sensor 700 can include magnetic sensing element such as a conductor 702 that is formed of a ferromagnetic material such as nickel, iron, or an alloy of nickel and iron. The conductor 702 can be a magnetic thin film. Conductor 702 can have a first electrical resistance. A voltage can be applied along the conductor 702. When a triggering magnetic element 704 is nearby, the presence of a magnetic field that is along the flow direction of the current can change the electrical resistance of the conductor 702. This can affect the voltage value across the conductor 702 and, hence, the presence of a triggering magnetic field parallel to the direction of the current can be detected. The AMR sensor 700 can be highly anisotropic in nature, meaning magnetic fields can have an effect on the electrical resistance of the conductor 702 almost only when the magnetic field is along the direction of current, but not in other directions. As such, the magnetic sensor 700 can have a detection axis 706 that is parallel to the flow of current. Moreover, since an AMR sensor is sensitive to a direction that is parallel to the current direction, the AMR sensor can be carried directly on the motherboard to detect a direction that is parallel to surface 108 shown in FIG. 1 of an electronic device. No extra board is required in this case.

While an AMR sensor is described in associated with FIG. 7, magnetic sensor 700 can also be any kinds of magneto-resistive sensors that are sensitive to a particular angle of magnetic field with respect to alignment of a magnetic sensing element. Other magneto-resistive sensors, such as GMR and TMR sensors, can work in a fashion that is similar to the AMR sensor shown in FIG. 7. For those sensors, the electrical resistance of the conductive magnetic sensing element can be sensitive to the change in the angle of the magnetic field relative to the magnetic sensing element. Hence, the detection axis of a magneto-resistive sensor can be aligned in a precise fashion.

Figure 8A:
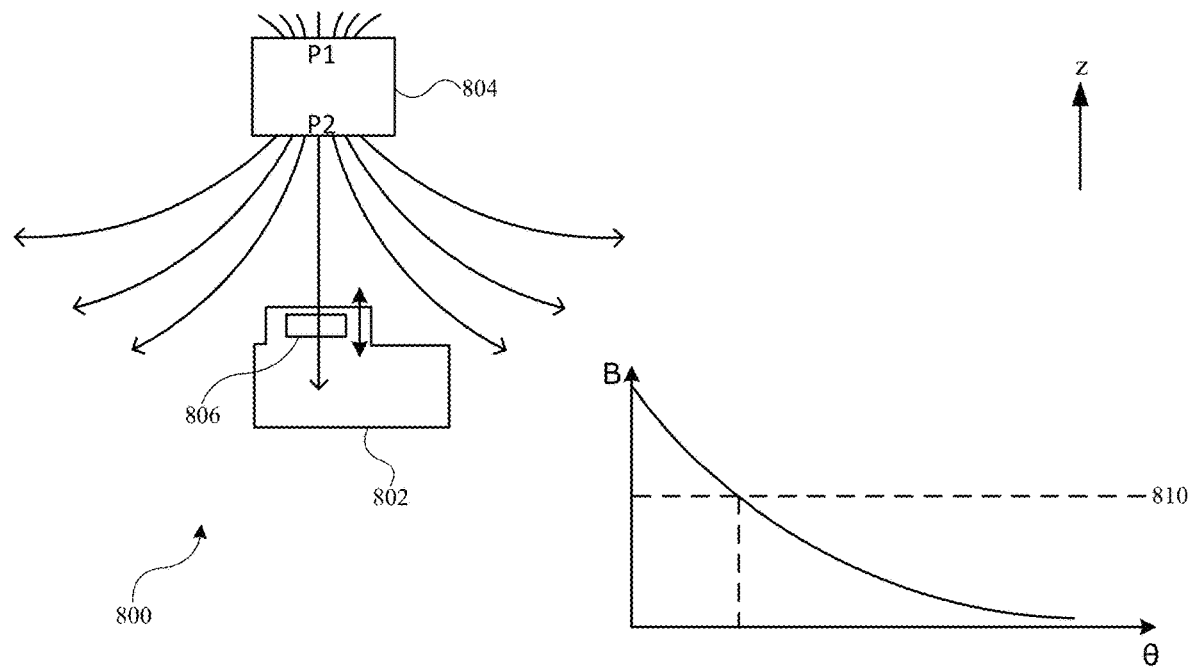
FIG. 8A illustrates a profile of a detected value of an electronic device.
Figure 8B:
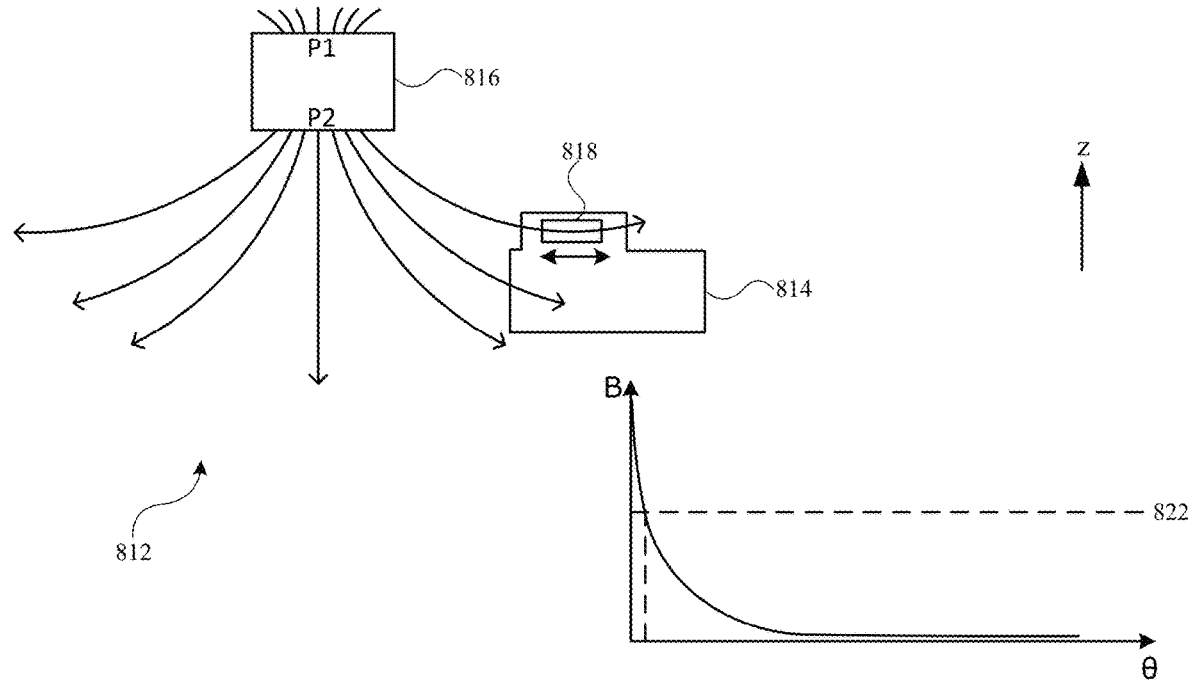
FIG. 8B illustrates a profile of a detected value of an electronic device using a magnetic sensor system in accordance with an embodiment.
Figure 10A:
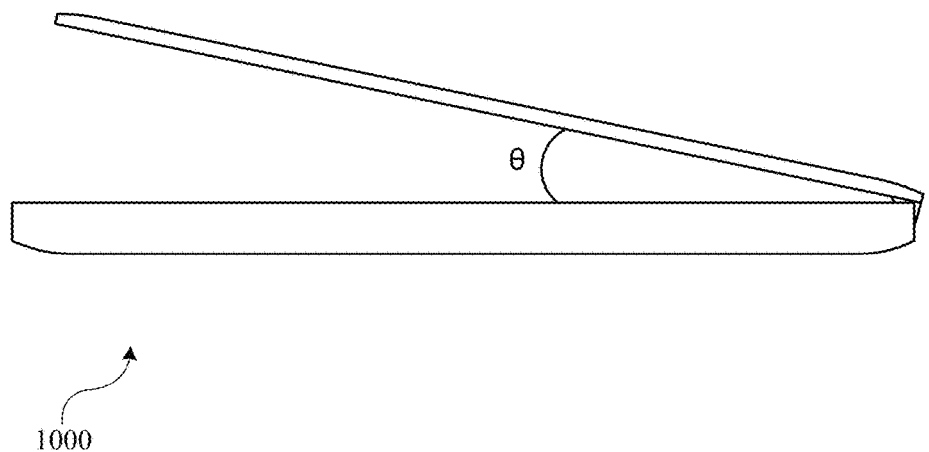
FIG. 10A is a side view of an electronic device.

FIGS. 8A and 8B illustrate some advantages of using a magnetic sensor system that utilizes a magneto-resistive sensor such as an AMR sensor. FIG. 8A shows a profile of a detected magnetic value B relative to an angle $\theta$ between a first portion and a second portion of an electronic device, such as the angle $\theta$ as shown in FIG. 10A, in the case of a Hall effect sensor. Angle $\theta$ can sometimes also represent the relative angle between a triggering magnetic field and a detection axis of a magnetic sensor. The magnetic sensor system 800 may use a Hall effect sensor 802 that is placed along the polarity alignment of triggering magnetic element 804. The Hall effect sensing element 806 can be adapted to detect a triggering magnetic field along the z-direction. The profile shows how the detected magnetic value changes along the change of the angle $\theta$. As the angle $\theta$ increases, the detected value decreases because the triggering magnetic element is further away from the sensor and the triggering magnetic element and the sensor become more and more un-aligned. Horizontal line 810 represents the triggering threshold value that can trigger the magnetic sensor 802. As shown in the profile, the range of angle $\theta$ that will trigger the magnetic sensor 802 is relatively large.

FIG. 8B shows a profile of a detected magnetic value B relative to an angle $\theta$ between a first portion and a second portion of an electronic device in the case of a magneto-resistive magnetic sensor system 812 such as an AMR sensor system in accordance with a described embodiment. Angle $\theta$ can sometimes also represent the relative angle between a triggering magnetic field and a detection axis of a magnetic sensor. AMR sensor 814 can include a magnetic sensing element 818 that has a detection axis that targets horizontal components of magnetic fields. AMR sensor 814 can be off-axis from triggering magnetic element 816. The profile of detected magnetic value relative to the change of the angle $\theta$ shows a significantly steeper curve. In some cases, the detected value can have a square of cosine relationship with the angle $\theta$. Since sensor 814 targets a very specific portion of magnetic field, the detected value drops quickly near zero degree even with a slight increase in angle $\theta$. As a result, for the same triggering threshold as represented by the line 822, a much narrower range of angle $\theta$ is observed. This means that only a narrow range of angle between a first and second portion of an electronic device can trigger the magnetic sensor. As a result, when the same type of magnetic sensor system is installed in different electronic devices of a same model, the electronic devices will behave consistently. The sensor system will be triggered roughly at the same angle θ when users fold the electronic device. Such a sharp sensitivity allows AMR magnetic sensor be used in an off-axis manner. Such a sharp sensitivity also allows the magnetic sensor to detect the triggering magnetic element with a high degree of confidence.

FIG. 9 is a table illustrating how two sets of magnetic sensor systems can cooperate to confirm that the electronic device is in one particular configuration, such as a closed configuration, and how the electronic device can switch between different modes based on the triggering of the magnetic sensors. A processor, which can be the central processing unit, in communication with both the first and second sensors can alter the operational state of the electronic device. The processor may only automatically turn the electronic device into an inactive mode, such as a sleep mode, when the processor receives signals representing that both the first and second sensors are triggered (i.e. when the first and second sensors each have the same detection status) or when a user manually inputs a command to enter the inactive mode. The processor will also only turn the electronic device from an inactive mode to an active mode when the processor receives signals representing that both the first and second sensors are not triggered or when a user manually inputs a command to enter the active mode. When only either one of the sensors is triggered such that the processor receives a first signal indicating either one of the two sensors is triggered but a second signal indicating another sensor is not triggered, the electronic device will stay in the current mode.

Figure 10B:
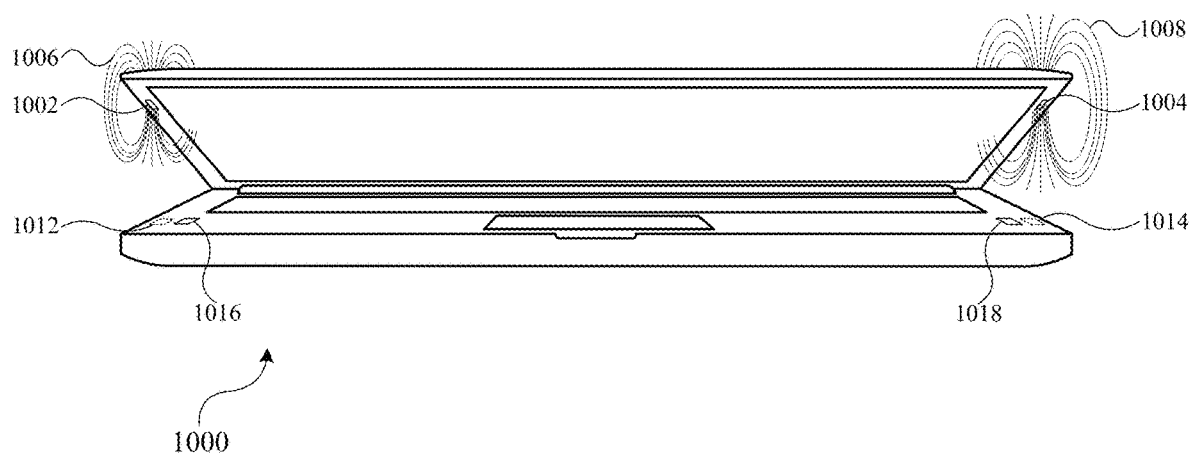
FIG. 10B illustrates how described embodiments resolve a problem of having more than one magnetic sensor systems.

FIGS. 10A and 10B illustrate a problem of having more than one magnetic sensor systems that the described embodiments resolve. An electronic device can have a single set of magnetic sensor system like sensor system 216 shown in FIG. 2 that targets vertical magnetic field to automatically activate or deactivate an inactive mode, but the electronic device is susceptible to interference as described above. While it might seem feasible to simply add a second set of conventional magnetic sensor system to perform the confirmation procedures as illustrated associated with FIG. 9, under real manufacturing conditions the addition of an extra set of sensor system can become challenging or not feasible when manufacturing tolerance factors are taken into consideration.

FIG. 10A shows an angle θ that represents the relative angle between a first portion and a second portion of an electronic device. FIG. 10B illustrates a scenario in a manufacturing condition. Commercial magnets often have a relative large manufacturing tolerance. In other words, magnet suppliers can provide magnetic elements with a relative large range of magnetic strength without violating the stated manufacturing tolerance even though the magnetic elements are sold under the same specification. Hence, each magnetic element put into different electronic devices during manufacturing of a large batch of devices being manufactured can have noticeably different strengths. FIG. 10B shows an electronic device 1000 that can include a first triggering magnetic element 1002 and a second triggering magnetic element 1004. First triggering magnetic element 1002 can have a first magnetic strength represented by magnetic field lines 1006 and second triggering magnetic element 1004 can have a second magnetic strength represented by magnetic field lines 1008. The second magnetic strength is notably stronger than the first magnetic strength. FIG. 10B shows two magnetic sensors 1012 and 1014 that are represented in dotted lines, which represent aligned magnetic sensors that detect magnetic fields in z-direction, such as the sensor system 216 shown in FIG. 2. As shown in FIG. 8A, even under the same magnetic strength for one magnet, the magnetic sensor can have a relatively wide triggering angle. But if the magnetic strengths of different magnets vary, the possible triggering angle will be even wider. When the confirmation method illustrated in FIG. 9 is adopted, the electronic device will only turn to an inactive mode when the weaker magnet, for example, triggering magnetic element 1002 triggers the magnetic sensor 1012 because it is the moment when both sensors are triggered. When the strength of the magnets vary, the actual angle that will turn the electronic device into the inactive mode will vary from one device to another, depending on the actual magnetic strength of the pair of magnets installed in each device. For example, some devices may enter the sleep mode when the angle θ is at 30 degree while other may only enter the sleep mode when the angle θ is at less than 10 degree. In some worst-case scenarios, some electronic devices may never automatically enter the sleep mode because one magnetic sensor fails to be triggered. This type of varying triggering angle is rather undesirable and sometimes unacceptable in term of manufacturing standard and tolerance.

The magnetic sensors in accordance with a described embodiment can provide significant improvement on limiting the variance of the trigger angle even if the magnets have different strength. In FIG. 10B, two magnetic sensors 1016 and 1018, which are represented in solid lines, can be two AMR sensors arranged in accordance with FIG. 7. The two AMR sensors can have a detected-value profile in accordance with FIG. 8B. As shown in FIG. 8B, the profile is very steep. As such, the triggering angle can be very narrow and consistent. Even if the strengths of the magnets 1002 and 1004 vary, the sleep-triggering angle for a pair of AMR sensors 1016 and 1018 can remain very consistently across different manufactured units, thanks to the steep detected-value profile exhibited by the sensors shown in FIG. 8B.

Figure 11:
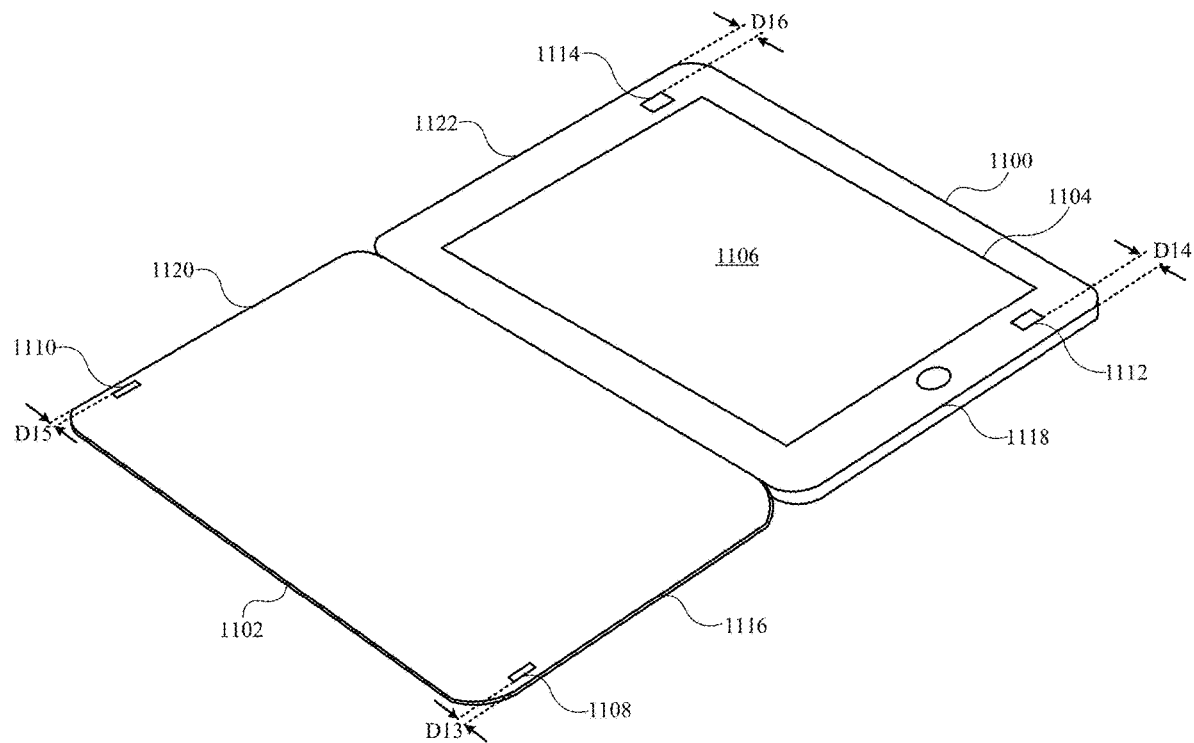
FIG. 11 illustrates an electronic device and an accessory device in accordance with an embodiment.

FIG. 11 is a perspective view of an electronic device system in accordance with another described embodiment. The electronic device system can include an electronic device 1100 and an accessory device 1102 that can be removably and pivotally coupled to electronic device 1100. In one case, accessory device 1102 can have a shape and size that is generally in accordance with electronic device 1100. Electronic device 1100 can be an electronic device such as a tablet device that can have a display 1104 with a touchscreen input interface. The accessory device 1102 can be protective in nature or simply an aesthetically pleasing adornment, or in some embodiments can be both protective and ornamental in nature. Accessory device 1102 can be formed of fabrics, polymer, natural or synthetic leather, plastic, or any material that is suitable for protecting the electronic device 1100.

Electronic device 1100 and accessory device 1102 combined can have at least an opening configuration and a closed configuration. When they are in the closed configuration, accessory device 1102 can be in contact or close to in contact with the surface 1106 of accessory device 1102 and at least partially or completely covers the surface 1106. Electronic device 1100 and accessory device 1102 can have two systems of magnetic sensors that are arranged in accordance a manner that is described previously. For example, electronic device 1100 can have two magnetic sensors 1112 and 1114 that target the horizontal component of the triggering magnetic field generated by triggering magnetic elements 1108 and 1110. Accessory device 1102 can have two triggering magnetic elements 1108 and 1110 and electronic device 1100 that are off-axis from the two magnetic sensors 1112 and 1114. The relative positions among the triggering magnetic elements and the sensors are similar to what is described in FIGS. 3 and 4. In other words, triggering magnetic element 1108 can be at a distance D13 from bottom edge 1116 while magnetic sensor 1112 can be at a distance D14 from bottom edge 1118. The distance D13 can be different than distance D14 so that magnetic sensor 1112 can be positioned laterally offset from triggering magnetic element 1108. Likewise, triggering magnetic element 1110 can be at a distance D15 from top edge 1120 while magnetic sensor 1114 can be at a distance D16 from top edge 1122. The distance D15 can be different than distance D16 so that magnetic sensor 1114 can be positioned laterally offset from triggering magnetic element 1110. The two sensors 1112 and 1114 can both have detection axes that are parallel to surface 1106. The two sensors 1112 and 1114 can cooperate in accordance with FIG. 9 to confirm that electronic device 1100 and accessory device 1102 are in a closed configuration and electronic device 1100 can automatically turns to an inactive mode, such as a sleep mode, based on the signals of the two sensors 1112 and 1114.

In some case, accessory device 1102 can be fixedly attached to electronic device 1102 and be considered as a second portion of the electronic device 1102 even though accessory device 1102 in some cases may not contain any electronic components. In other cases, accessory device 1102 also contain electronic components that are coupled to and in communication with the electronic components in electronic device 1100. For example, in some cases, the accessory device 1102 can both be a cover and a keyboard.

While certain embodiments, such as those shown in FIG. 1 or FIG. 11, are described to have two portions that are pivotally coupled to each other, those skilled in the art will understand that the two portions can be coupled to each other using other methods. For example, in some cases, the two portions can be removable attached to each other via any mechanical methods such as friction or via a magnetic pairing. A processor can use the magnetic sensor systems described in this paper to deduce when the two removable parts come together. In addition, the described magnetic sensor system can be used for two portions that can independently operate. For example, the two portions can be in fact two independent electronic devices such as two phones or one laptop and one tablet. A processor can deduce whether the two independent electronic devices come into contact in certain orientation based on the described magnetic sensor systems. Furthermore, while an inactive mode is described to be associated with the triggering of the magnetic sensor, any other active or inactive modes can be used with the trigger of the magnetic sensor. For example, when the sensor in a device is triggered, the device can switch to a high power mode or a charging mode. In one case, a first device can be a portable electronic device while the second device can be a charger.

Figure 12:
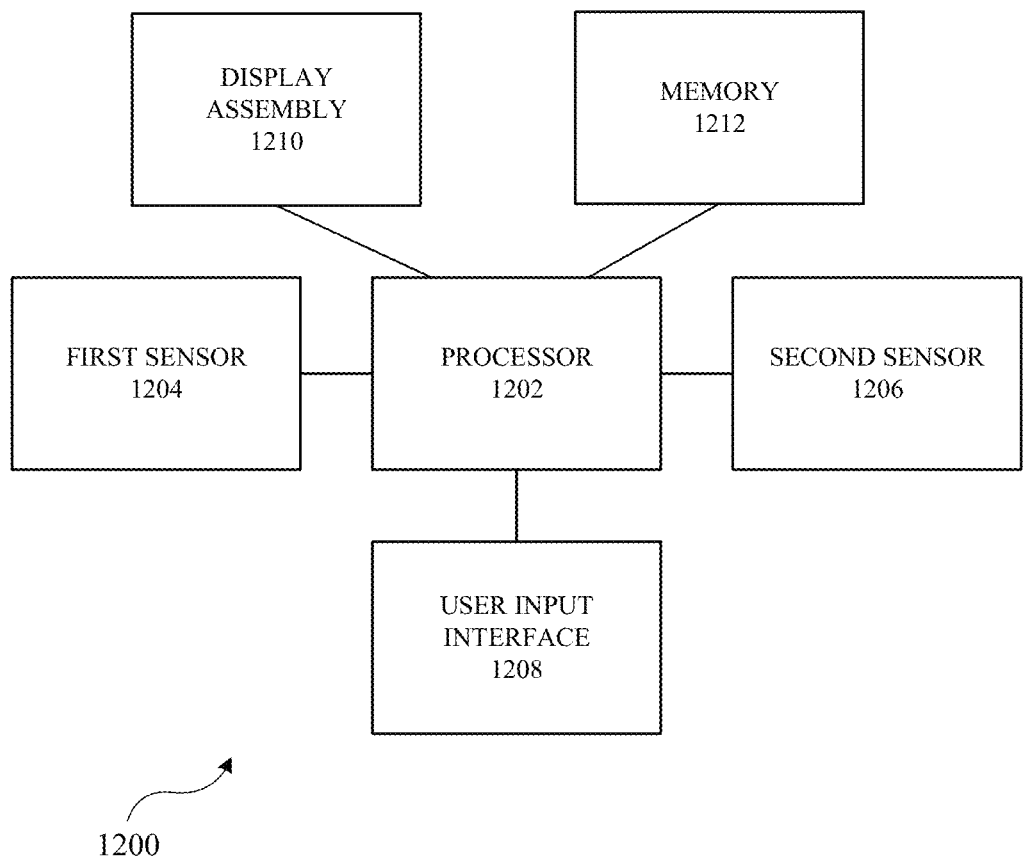
FIG. 12 is a block diagram illustrating internal circuitry of an electronic device in accordance with an embodiment.

FIG. 12 is a block diagram illustrating internal circuitry 1200 of an electronic device in accordance with some embodiments. A processor 1202 is connected to two magnetic sensors 1204 and 1206. The processor 1202 can be a central processing unit (CPU) of the electronic device or a secondary processor that is in communication with the CPU of the electronic device. The processor 1202 can further be connected to a user input interface 1208 and a display assembly 1210. User input interface 1208 can be any interface including a power button, a keyboard, a trackpad, a mouse, an external input device that is connected to the electronic device via standard protocol such as a Universal Serial Bus. User input interface 1208 can receive a command and transmit the command to the processor 1202 that causes the electronic device to transition between different modes. For example, a user can manually issue a command to turn on or off the electronic device or awake the electronic device from a sleep mode. User input interface 1208 can also be a wireless interface that allows the user to remotely switch the modes of the electronic device such as to remotely awake the electronic through the Internet. While only one block 1208 is shown in FIG. 12 for simplicity, those skilled in the art will understand that the processor 1202 can be coupled to multiple different user input interfaces and other interfaces. The magnetic sensors 1204 and 1206 can be triggered by triggering magnetic elements. The detection status of the magnetic sensors may signify that the electronic device is in a particular configuration. The triggering can result in a transmission of signals from sensors 1204 and 1206 or a change in voltage output of sensors 1204 and 1206 that can be amplified by certain operational amplifier circuit (not shown). The processor 1202 can be associated with a memory 1212 or can have its own internal memory that stores instructions or a look-up table that causes the electronic device to switch from one mode to another based on the output of the sensors 1204 and 1206. For example, a look-up table can incorporate the rules illustrated in FIG. 9 and the processor 1202 can cause the display 1210 to turn off based on the detection status of both sensors 1204 and 1206.

Figure 13:
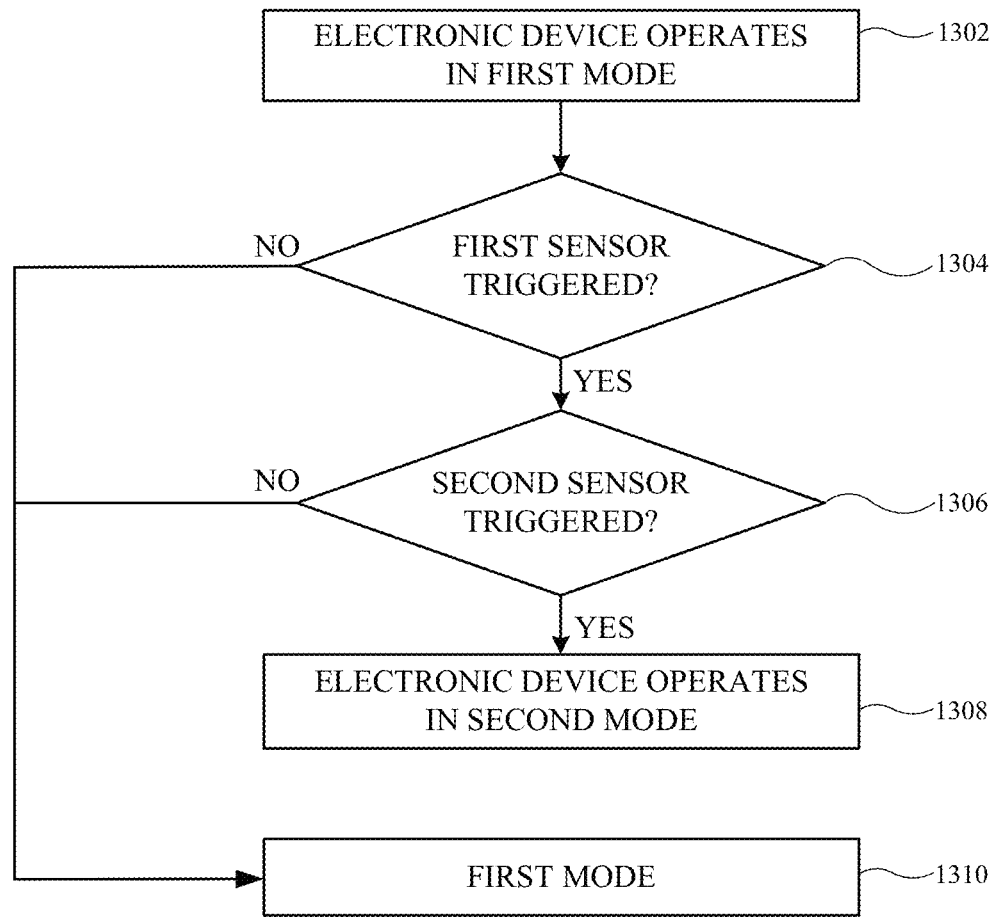
FIG. 13 is a flowchart depicting a method for automatically switch an electronic device from one mode to another.

FIG. 13 illustrates a flowchart 1300 depicting a method for automatically altering an operational state of an electronic device between a first mode and a second mode. Magnetic sensor systems can be carried by the electronic device having at least two parts capable of movement with respect to each other. In one case, a first part can include first and second magnetic elements that provide separate first and second magnetic fields characterized as having a first and second magnetic polarity alignment, respectively. A second part can have first and second magnetic sensors having first and second magnetic detection axes that are, respectively, generally orthogonal to and displaced from the first and second magnetic polarity alignments. The first and second magnetic sensors can be selectively sensitive to, respectively, selected aspects of the first and second magnetic fields within a detection distance. The method can begin at step 1302 when the electronic device is operating in a first mode such as an active mode. In some cases, the first mode can be associated with a first configuration such as an open configuration. The method can also include step 1304, which can be a decision stage that determines whether the first sensor is triggered. A sensor can be triggered when the strength of selected aspects of a detected triggering magnetic field strength becomes sufficiently strong to cross or be at least equal to a triggering threshold of the magnetic sensor. The increase in the detected triggering magnetic field strength can be associated with a user changing the configuration of the electronic device from the first configuration to a second configuration. A second configuration can be a closed configuration. A first triggering magnetic element can reach within a detection distance of the first magnetic sensor and have a horizontal component of its magnetic field sufficiently strong to cross the triggering threshold of a first magnetic sensor when the first triggering magnetic element is bought near the first magnetic sensor. In response to detecting the first magnetic field as having a first magnetic strength that crosses the triggering threshold, the first magnetic sensor can provide a detection signal representing the detection status to a processor of the electronic device. Then the processor can determine whether the first magnetic sensor is triggered based on the detection signal. The method can also include step 1306, which can be a decision stage that determines whether the second sensor is triggered. A second triggering magnetic element can reach within detection distance of the second magnetic sensor and have a horizontal component of its magnetic field sufficiently strong to cross a second triggering threshold of a second magnetic sensor when the second triggering magnetic element is bought near the second magnetic sensor. In response to detecting the second magnetic field as having a second magnetic strength that crosses the triggering threshold, the second magnetic sensor can provide a detection signal representing the detection status to the processor of the electronic device. Then the processor can determine whether the first magnetic sensor is triggered based on the detection status. Decision stages 1304 and 1306 can occur separately or simultaneously. If both sensors are triggered, at step 1308, the processor can, in turn, cause the electronic device to switch from the first mode to the second mode. The second mode can be an inactive mode such as a sleep mode. In one case, the processor will only turn the electronic device to a second mode when the triggering of the first magnetic sensor and triggering of the second magnetic sensor are both detected. The electronic device will remain in the first mode if only one sensor is triggered or no sensor is triggered, as indicated by the arrows of decision stages 1304 and 1306 pointing to first mode 1310.

Figure 14:
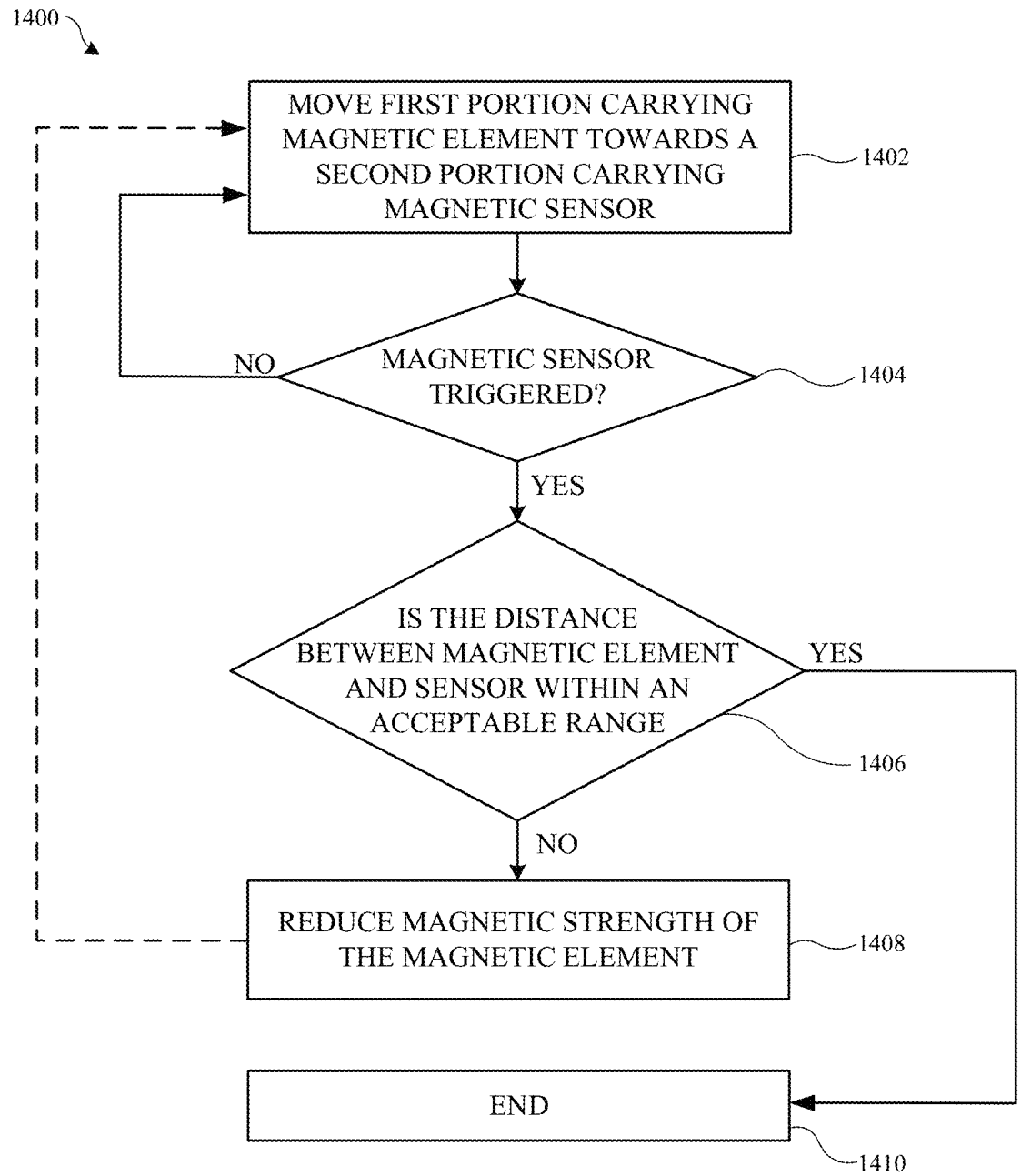
FIG. 14 is a flowchart depicting a method for assembling a magnetic sensor system to an electronic device.

FIG. 14 illustrates a flowchart of an illustrative process for calibrating a magnetic sensor system installed in an electronic device. The electronic device can include a first portion that carries a triggering magnetic element and a second portion that carries a magnetic sensor. In some cases, a triggering magnetic element can be a magnet and can be further magnetized to increase its magnetic strength before the magnet is installed in the first portion. Process 1400 can begin at step 1402, the first portion carrying the triggering magnetic element can be moved towards a second portion carrying the triggering magnetic sensor so that the magnetic element can be brought towards the detection distance of the magnetic sensor. At step 1404, when the first portion continues to move towards the second portion, at a certain distance (or angle) the magnetic sensor is triggered. A sensor can be triggered when the strength of selected aspects of a detected triggering magnetic field strength becomes sufficiently strong to cross or be at least equal to a triggering threshold of the magnetic sensor. If the magnetic sensor has not been triggered, the first portion can continue to be moved towards to the second portion until the magnetic sensor is triggered. At decision stage 1406, the distance between the triggering magnetic element and the magnetic sensor can be determined when the magnetic sensor is triggered. The distance can be compared to an acceptable range. If the distance is within the acceptable range, this can mean that the triggering magnetic element is not too strong to trigger the magnetic sensor beyond the targeted detection distance. In that case, the calibration can be completed at step 1410. If the distance is beyond the acceptable range, this can mean that the triggering magnetic element may be too strong. At step 1408, the triggering magnetic element can be tuned to reduce the magnetic strength of the triggering magnetic element. In the case when the first portion is a portion that may carry other magnets, such as a display portion carrying other display magnets, the tuning of the triggering magnetic element can be performed along with the other magnets. After the triggering magnetic element is tuned, steps 1402-1406 can optionally be repeated to further calibrate the magnetic sensor system to ensure the calibration is performed properly. Also, the above steps can be repeated for a second set of magnetic sensor system.

According to one embodiment, a laptop computer is described. The laptop computer can include a first housing that can be used to carry a display at a first surface. The laptop computer can also include a second housing that is pivotally coupled to the first housing. The second housing can be used to carry a keyboard at a second surface that at least partially faces the first surface. The first housing can move towards the second housing such that in a closed configuration, the first and second surfaces are at least in close proximity and are generally parallel to each other. The laptop computer can further include at least two magnetic sensor systems. In each of the magnetic sensor system, the system can include a triggering magnetic element carried by the first housing and a magnetic sensor carried by the second housing. Moreover, in the closed configuration, the triggering magnetic element and the magnetic sensor can be laterally offset from each other. In one embodiment, edges in the first and second housings are aligned with each other in the closed configuration, and a distance between a nearest edge of the first housing and a first triggering magnetic element is less than a distance between a nearest edge of the second housing and the associated first magnetic sensor. In one embodiment, the laptop computer is operable between a first mode and a second mode. The laptop computer automatically changes from the first mode to the second mode only (i) when each of the magnetic sensors detects a threshold value of a triggering magnetic field provided by the triggering magnetic element or (ii) when each of the magnetic sensors detects less than the threshold value. In one embodiment, the first mode is an awake mode and the laptop is operable in the awake mode when each of the magnetic sensors detects less than the threshold value of the triggering magnetic field; the second mode is a sleep mode and the laptop computer is operable in the sleep mode when each of the magnetic sensors detects at least the threshold value of the triggering magnetic field. In one embodiment, each of the magnetic sensors is oriented such that a detection axis generally parallel to the second surface. In one embodiment, each of the triggering magnetic elements has a magnetic polarity alignment that is generally perpendicular to the first surface. In one embodiment, each of the triggering magnetic elements has a magnetic polarity alignment that is not perpendicular to the second surface. In one embodiment, at least one of the magnetic sensors is selected from a group consisting of a Hall effect sensor, an anisotropic magneto-resistive (AMR) sensor, a giant magneto-resistive (GMR) sensor, and a tunnel magneto-resistive (TMR) sensor. In one embodiment, at least one of the magnetic sensors is carried on a motherboard of the laptop computer.

According to another embodiment, a laptop computer is described. The laptop computer can include a first and second portions that are coupled to each other and pivotally movable relative to each other such that in a closed configuration, edges of the first and second portions can come in contact and can be generally parallel to each other. The laptop computer can also include a triggering magnetic element carried by the first portion. The triggering magnetic element can be located a first distance from a first portion edge. The laptop computer can further include a magnetic sensor carried by the second portion and located a second distance from second portion edge. The second portion edge can be in contact with and parallel to the first portion edge in the closed configuration, and the first distance can be different than the second distance. In one embodiment, the laptop computer can further include a second triggering magnetic element carried by the first portion and that generates a second triggering magnetic field. The laptop computer can also include a second magnetic sensor carried by the second portion. In one embodiment, the laptop computer can further include a processor in communication with the magnetic sensors and that automatically changes an operation state of the laptop when the magnetic sensor and the second magnetic sensor each have a same detection status. In one embodiment, the triggering magnetic element can be characterized as having a magnetic polarity alignment and provides a triggering magnetic field in accordance with the magnetic polarity alignment, and the magnetic sensor can have a detection axis that is non-parallel with respect to the magnetic polarity alignment of the triggering magnetic element. In one embodiment, the laptop computer can automatically change to a sleep mode from an active mode when, during the active mode, the magnetic sensor detects a threshold value of a triggering magnetic field generated by the triggering magnetic element. In one embodiment, the laptop computer can automatically awake from a sleep mode when, during the sleep mode, the magnetic sensor detects less than a threshold value of a triggering magnetic field generated by the triggering magnetic element. In one embodiment, the magnetic sensor is carried by the motherboard.

According to yet another embodiment, a method can be operated by a processor to alter an operational state of a laptop computer using two magnetic sensor systems in communication with the processor is described. The magnetic sensor systems can each include a triggering magnetic element carried by a first portion of the laptop computer, and a corresponding magnetic sensor carried by the second portion. The magnetic sensor can be selectively sensitive to a triggering magnetic field provided by the associated triggering magnetic element. In one case, the magnetic sensor can be carried by a second portion of the laptop computer. The second portion can be pivotally coupled to the first portion. When the processor determines that a first and a second magnetic sensor each have a same detection status of the triggering magnetic field, then the processor can alter an operational state of the laptop in accordance with the detection status. Otherwise, the processor maintains a current operational state of the laptop computer. In an embodiment, each of the magnetic sensors can be laterally offset from the respective triggering magnetic element when the laptop computer is in a closed configuration. In an embodiment, each of the magnetic sensors can have a detection axis that is offset and non-parallel to a magnetic polarity alignment of the respective triggering magnetic element when the laptop computer is in a closed configuration. In an embodiment, the first portion can carry a motherboard of the laptop computer and the second portion can carry a display.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data that can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A laptop computer comprising:
   first and second housing portions that are coupled to each other and capable of pivoting relative to each other between an open configuration and a closed configuration such that in the closed configuration edges of the first and second housing portions are parallel to each other; and
   a magnetic sensor system including:
     first and second triggering magnetic elements carried by the first housing portion;
     first and second magnetic sensors carried by the second housing portion, the first and second magnetic sensors being laterally displaced from the first and second triggering magnetic elements when the first and second housing portions are in the closed configuration, wherein the first magnetic sensor has a first magnetic detection axis capable of interacting with the first triggering magnetic element, and the second magnetic sensor has a second magnetic detection axis capable of interacting with the second triggering magnetic element;
     the first triggering magnetic element has a magnetic polarity oriented parallel to the first magnetic detection axis and the second triggering magnetic element has a magnetic polarity oriented perpendicular to the second magnetic detection axis in the closed configuration; and
     the laptop computer automatically changes from an active mode to a sleep mode when the first magnetic sensor detects a first magnetic field strength above a first threshold and the second magnetic sensor detects a second magnetic field strength above a second threshold.

2. The laptop computer as recited in claim 1, wherein at least one of the first magnetic sensor or the second magnetic sensor is a Hall effect sensor, an anisotropic magneto-resistive (AMR) sensor, a giant magneto-resistive (GMR) sensor, or a tunnel magneto-resistive (TMR) sensor.

3. The laptop computer as recited in claim 1, wherein the first magnetic sensor is carried on a motherboard of the laptop computer.

4. The laptop computer as recited in claim 1, further including a processor in communication with the first and second magnetic sensors.

5. The laptop computer as recited in claim 1, wherein the laptop computer automatically wakes from the sleep mode when, during the sleep mode, the first magnetic field strength detected by the first magnetic sensor is less than the first threshold or the second magnetic field strength detected by the second magnetic sensor is less than the second threshold.

6. A method operable by a processor of altering an operational state of a laptop computer using two magnetic sensor systems in communication with the processor;
the first magnetic sensor system including a first triggering magnetic element and a first magnetic sensor that are disposed at a first side of the laptop computer;
the second magnetic sensor system including a second triggering magnetic element and a second magnetic sensor that are disposed at a second side of the laptop computer different than the first;
the laptop having a closed configuration and an open configuration and the first and second magnetic sensors being laterally displaced from the first and second triggering magnetic elements when the laptop is in the closed configuration;
the first triggering magnetic element having a magnetic polarity oriented perpendicular to a magnetic detection axis of the first magnetic sensor and the second triggering magnetic element having a magnetic polarity oriented parallel to a magnetic detection axis of the second magnetic sensor when the laptop computer is in the closed configuration, the method comprising:
receiving a first detection signal from the first magnetic sensor associated with a detected first magnetic field strength and receiving a second detection signal from the second magnetic sensor associated with a detected second magnetic field strength; and
in response to determining that the first detection signal exceeds a first threshold and the second detection signal exceeds a second threshold, altering an operational state of the laptop from an active mode to a sleep mode, otherwise, maintaining a current operational state of the laptop computer.

7. The method as recited in claim 6, wherein the laptop includes a first housing portion that carries a motherboard and a second housing portion that carries a display.

* * * * *